United States Patent
Lee et al.

(10) Patent No.: US 9,281,344 B2
(45) Date of Patent: Mar. 8, 2016

(54) MAGNETIC MEMORY DEVICE

(71) Applicant: Samsung Electronics Co., Ltd., Suwon-Si, Gyeonggi-Do (KR)

(72) Inventors: Jae-kyu Lee, Yongin-si (KR); Ki-Seok Suh, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/599,064

(22) Filed: Jan. 16, 2015

(65) Prior Publication Data

US 2015/0221699 A1 Aug. 6, 2015

(30) Foreign Application Priority Data

Feb. 4, 2014 (KR) ........................ 10-2014-0012796

(51) Int. Cl.
*H01L 29/82* (2006.01)
*H01L 27/22* (2006.01)
*H01L 43/02* (2006.01)
*H01L 43/08* (2006.01)

(52) U.S. Cl.
CPC .............. *H01L 27/228* (2013.01); *H01L 43/02* (2013.01); *H01L 43/08* (2013.01)

(58) Field of Classification Search
CPC ........ H01L 43/08; H01L 27/222; H01L 41/12
USPC ................. 257/295, 421; 438/3, 239
See application file for complete search history.

(56) References Cited

U.S. PATENT DOCUMENTS

| | | | |
|---|---|---|---|
| 6,724,653 B1 | 4/2004 | Iwata et al. | |
| 6,876,575 B2 | 4/2005 | Hidaka | |
| 7,019,370 B2 | 3/2006 | Cha | |
| 7,286,395 B2 | 10/2007 | Chen et al. | |
| 7,408,802 B2 | 8/2008 | Zheng et al. | |
| 7,672,155 B2 | 3/2010 | Kim et al. | |
| 7,796,422 B2 | 9/2010 | Kajiyama | |
| 7,977,756 B2 | 7/2011 | Aoki | |
| 8,009,467 B2 | 8/2011 | Nebashi et al. | |
| 8,432,727 B2 | 4/2013 | Ryu et al. | |
| 8,437,181 B2 | 5/2013 | Yang et al. | |
| 2002/0101760 A1 | 8/2002 | Naji | |
| 2006/0023490 A1* | 2/2006 | Boeve | 365/158 |
| 2011/0133270 A1* | 6/2011 | Juengling | 257/331 |
| 2012/0327701 A1 | 12/2012 | Nazarian | |
| 2013/0021836 A1 | 1/2013 | Liu | |
| 2013/0040408 A1* | 2/2013 | Nam et al. | 438/3 |
| 2013/0064011 A1 | 3/2013 | Liu et al. | |
| 2013/0100732 A1 | 4/2013 | Xia | |
| 2014/0126265 A1 | 5/2014 | Lee et al. | |

FOREIGN PATENT DOCUMENTS

JP 2007-317948 A 12/2007
JP 2012-195038 A 10/2012

* cited by examiner

*Primary Examiner* — Theresa T Doan
(74) *Attorney, Agent, or Firm* — Harness, Dickey & Pierce

(57) ABSTRACT

The magnetic memory device includes a plurality of source lines arranged in parallel in a second direction orthogonal to a first direction while extending in the first direction on a substrate, a plurality of word lines arranged in parallel in the first direction while extending in the second direction on the substrate, a plurality of bit lines arranged in parallel in the second direction while extending in the first direction on the substrate to alternate with the plurality of source lines, and a plurality of active regions arranged to extend at an oblique angle with respect to the first direction and arranged so that one memory cell is selected when one of the plurality of word lines and one of the plurality of source lines or the plurality of bit lines are selected.

20 Claims, 23 Drawing Sheets

MAGNETIC MEMORY DEVICE

CROSS-REFERENCE TO RELATED APPLICATIONS

This application claims priority to Korean Patent Application No. 10-2014-0012796, filed on Feb. 4, 2014, in the Korean Intellectual Property Office, the disclosure of which is incorporated herein in its entirety by reference.

BACKGROUND

The inventive concepts relates to a magnetic memory device, and more particularly, to a magnetic memory device including a memory cell array region formed of bit lines, source lines, and access transistors.

As a semiconductor product is downsized, highly integrated, and more multi-functional, it is required to process high capacity data in a small area. Therefore, research on a memory device used for the semiconductor product, capable of increasing an operation speed thereof and refining a pattern thereof to highly integrate the same is being conducted. To refine the pattern of the highly integrated memory device, a new lithography or a high-priced process technology is desired such that research on a new integration technology is being performed. For example, a magnetic memory device including magnetic tunnel junction (MTJ) devices has been researched.

SUMMARY

At least one example embodiment of the inventive concepts provides a magnetic memory device including a memory cell array structure capable of maintaining the magnetic memory device highly integrated and being operated at a low voltage.

According to an aspect of the inventive concepts, there is provided a magnetic memory device, including a plurality of active regions that are defined on a substrate by an isolation film, that are extended in one direction so that a first region and a second region are provided at both ends of each of the plurality of active regions, arranged so that the one direction forms an oblique angle with respect to a first direction, and arranged in parallel in a second direction intersecting the first direction, a plurality of word lines arranged in parallel in the first direction while extending in the second direction on the substrate across corresponding ones of the plurality of active regions arranged in the second direction, a plurality of source lines arranged in parallel in the second direction while extending in the first direction and commonly and electrically connected to the first regions of corresponding ones of the plurality of active regions arranged in the first direction, a plurality of variable resistance structures arranged in the first and second directions to correspond to the plurality of active regions, respectively, and electrically connected to the second regions of corresponding ones of the plurality of active regions, and a plurality of bit lines arranged in parallel in the second direction while extending in the first direction to alternate with the plurality of source lines and commonly and electrically connected to corresponding ones of the plurality of variable resistance structures arranged in the first direction, when a source line adjacent to a first bit line that is one of the plurality of bit lines below the first bit line in the second direction is referred to as a lower source line and a source line adjacent to the first bit line above the first bit line in the second direction is referred to as an upper source line, in the first direction, the plurality of active regions are alternately arranged between the first bit line and the lower source line and between the first bit line and the upper source line.

According to an aspect of the inventive concepts, when a bit line adjacent to a first source line that is one of the plurality of source lines below the first source line in the second direction is referred to as a lower bit line and a bit line adjacent to the first source line above the first source line in the second direction is referred to as an upper bit line, in the first direction, the plurality of active regions may be alternately arranged between the first source line and the lower bit line and between the first source line and the upper bit line.

According to an aspect of the inventive concepts, when two adjacent source lines among the plurality of source lines are referred to first and second source lines, a bit line arranged between the first and second source lines is referred to as a second bit line, a plurality of active regions arranged between the first source line and the second bit line are referred to as first group active regions, and a plurality of active regions arranged between the second source line and the second bit line are referred to as second group active regions, the first regions of the first group active regions may be electrically connected to the first source line, the first regions of the second group active regions may be electrically connected to the second source line, and the second regions of the first group active regions and the second group active regions may be electrically connected to the second bit line.

According to an aspect of the inventive concepts, different ones of the plurality of word lines cross the plurality of active regions of the first group active regions and the second group active regions, respectively, and only one active region may be selected among the plurality of active regions of the first group active regions and the second group active regions by selecting a first word line that is one of the plurality of word lines.

According to an aspect of the inventive concepts, at least one of a pitch of the plurality of bit lines in the second direction and a pitch of the plurality of source lines in the second direction is 4F, a pitch of the plurality of word lines in the first direction is 2F, and a unit memory cell of the magnetic memory device has a size of $8F^2$. Here, F may mean a minimum lithographic feature size.

According to an aspect of the inventive concepts, four second active regions may be arranged to be adjacent to a first active region, each of the first and second active regions being one of the plurality of active regions, the four second active regions may extend in a same direction, and the first active region may extends in a direction intersecting the direction in which the second active regions extend.

According to an aspect of the inventive concepts, the magnetic memory device is divided into units of blocks along column source lines and, in each block, a number of the plurality of source lines are connected to one of the column source lines through source line selecting transistors so that, on each boundary between two blocks, two source line selecting transistors may be connected to one of the plurality of source lines and the two source line selecting transistors may be connected to the column source lines of different blocks, respectively.

According to an aspect of the inventive concepts, the plurality of word lines may have upper surfaces positioned on a lower level as that of an upper surface of the substrate.

According to an aspect of the inventive concepts, the plurality of variable resistance structures may be arranged on at least one insulating layer formed on the plurality of active regions, and the plurality of variable resistance structures may be electrically connected to corresponding ones of the plurality of active regions through contact plugs formed through the at least one insulating layer, respectively.

According to an aspect of the inventive concepts, the second region of a first active region that is one of the plurality of active regions may be electrically connected to only a corresponding first variable resistance structure that is one of the plurality of variable resistance structures, the first region of the first active region is one of the plurality of active regions may be electrically connected to a first source line that is one of the plurality of source lines, and a different word line from a word line that crosses the first active region may cross a second active region adjacent to the first active region and having a first region thereof electrically connected to the first source line, the different word line being one of the plurality of word lines.

According to another aspect of the inventive concepts, there is provided a magnetic memory device, including a plurality of source lines arranged in parallel in the second direction orthogonal to the first direction while extending in the first direction on a substrate, a plurality of word lines arranged in parallel in a first direction while extending in a second direction on the substrate, a plurality of bit lines arranged in parallel in the second direction while extending in the first direction on the substrate to alternate with the plurality of source lines, and a plurality of active regions arranged to extend at an oblique angle with respect to the first direction and arranged so that one memory cell is selected when one of the plurality of word lines and one of the plurality of source lines or the plurality of bit lines are selected.

According to another aspect of the inventive concepts, each of the plurality of active regions may include a first region and a second region at both ends thereof, a first word line that is one of the plurality of word lines may cross a plurality of active regions arranged in the second direction, a first source line that is one of the plurality of source lines may be commonly and electrically connected to the first regions of corresponding one of the plurality of active regions arranged in the first direction, a first bit line that is one of the plurality of bit lines may be commonly and electrically connected to the second regions of corresponding one of the plurality of active regions arranged in the first direction, a plurality of active regions having first regions thereof electrically connected to two source lines of the plurality of source lines adjacent to the first bit line may share the first bit line, and a plurality of active regions having second regions thereof electrically connected to two bit lines of the plurality of bit lines adjacent to the first source line may share the first source line.

According to another aspect of the inventive concepts, when the plurality of active regions are arranged between the first bit line that is one of the plurality of bit lines and a first source line adjacent to the first bit line to form the one memory cell in each active region, along the first word line that is one of the plurality of word lines, no memory cell adjacent to the one memory cell may be formed between the first bit line and the source line and between the first source line and the bit line.

According to another aspect of the inventive concepts, when a plurality of active regions are arranged between the first bit line that is one of the plurality of bit lines and a first source line adjacent to the first bit line to form the one memory cell in each active region, a plurality of memory cells may be arranged in zigzags in the first and second directions.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
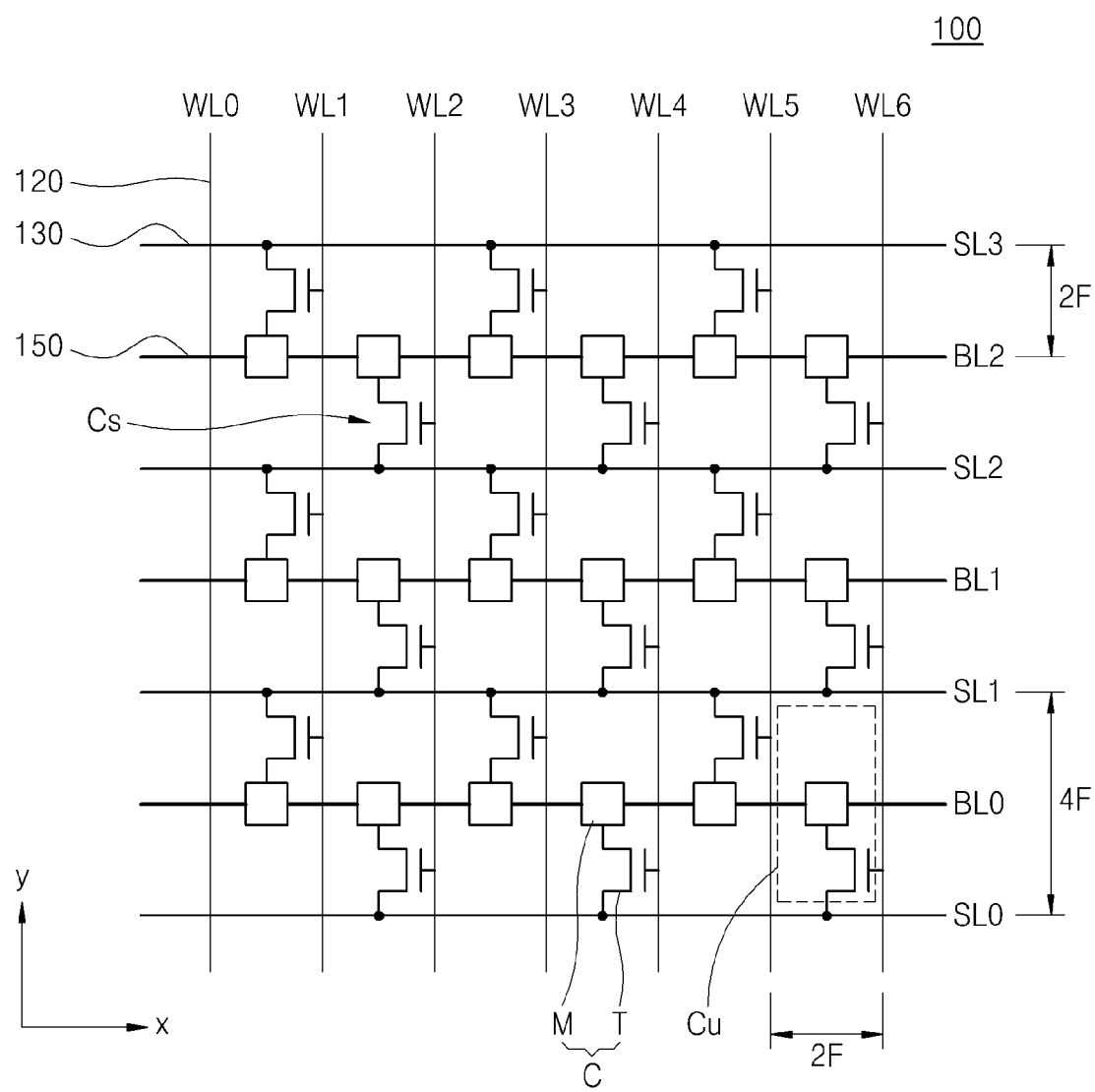
FIG. 1 is a circuit diagram of a memory cell array of a magnetic memory device according to an embodiment of the inventive concepts.

The inventive concepts will now be described more fully with reference to the accompanying drawings, in which example embodiments of the inventive concepts are shown.

The inventive concepts may, however, be embodied in many different forms and should not be construed as limited to the example embodiments set forth herein. Rather, these embodiments are provided so that this disclosure will be thorough and complete, and will fully convey the scope of the inventive concepts to one of ordinary skill in the art.

It will also be understood that when an element is referred to as being connected to another element, it can be directly connected to the other element or intervening elements may also be present. Similarly, it will also be understood that when an element is referred to as being on another element, it can be directly on the other element, or intervening elements may also be present. In the drawings, the thicknesses of elements are exaggerated for clarity. The same elements in the drawings are denoted by the same reference numerals and a repeated explanation thereof will not be given. On the other hand, terms used herein are not for limiting the scope of the inventive concepts mentioned in the claims and are for describing the inventive concepts.

FIG. 1 is a circuit diagram of a memory cell array of a magnetic memory device according to an embodiment of the inventive concepts.

Referring to FIG. 1, the memory cell array of the magnetic memory device 100 may include a plurality of memory cells C arranged in a matrix. Each of the plurality of memory cells C may include an access transistor T and a memory M. In addition, the memory cell array may include a plurality of word lines WL 120, a plurality of source lines SL 130, and a plurality of bit lines BL 150. The plurality of memory cells C may be electrically connected to the corresponding word lines WL 120, source lines SL 130, and bit lines BL 150, respectively.

As illustrated in FIG. 1, the plurality of word lines WL 120 may extend in a second direction (a y direction) while being arranged in parallel in a first direction (an x direction). The plurality of source lines SL 130 may be arranged in parallel in the second direction while extending in the first direction. The plurality of bit lines BL 150 may be arranged in parallel in the second direction while extending in the first direction like the source lines SL 130. However, the plurality of source lines SL 130 and the plurality of bit lines BL 150 may be alternately arranged in the second direction.

In such a memory cell array structure, source lines SL 130 that extend in the same direction as that of a bit line BL 150 alternately share memory cells C with the bit line BL 150 adjacent thereto. In particular, when one word line WL 120 is selected, since there is no memory cell C around a selected memory cell C, it is possible to prevent a memory cell C from being repeatedly selected. That is, in the memory cell array structure according to the present embodiment, there is no memory cell C immediately adjacent to one memory cell C along one word line WL 120 and a memory cell C immediately adjacent to the one memory cell C may be arranged in another word line WL 120 adjacent to the one word line WL 120.

Specifically, a connection relationship between the memory cells C and the word lines WL 120, the source lines SL 130, and the bit lines BL 150 will be described as follows.

The plurality of word lines WL 120 are connected to gates of the access transistors T of the plurality of memory cells C so that each of two adjacent word lines 120 may be connected to gates of access transistors T arranged in different positions in the second direction. For example, a second word line WL1 may be connected to gates of access transistors T arranged between a first bit line BL0 and a second source line SL1, between a second bit line BL1 and a third source line SL2, and between a third bit line BL2 and a fourth source line SL3 and a third word line WL2 may be connected to gates of access transistors T arranged between a first source line SL0 and the first bit line BL0, between the second source line SL1 and the second bit line BL1, and between the third source line SL2 and the third bit line BL2.

The plurality of source lines SL 130 are connected to sources or drains of the access transistors T of the plurality of memory cells C so that each of the plurality of source lines SL 130 may be alternately connected to sources or drains of access transistors T connected to different bit lines BL 150 in the first direction. For example, the second source line SL1 may be alternately connected to sources or drains of an access transistor T connected to the first bit line BL0 and an access transistor T connected to the second bit line BL1 in the first direction.

The plurality of bit lines BL 150 are connected to the drains or sources of the access transistors T of the plurality of memory cells C so that each of the plurality of bit lines BL 150 may be alternately connected to drains or sources of access transistors T connected to different source lines SL 130 in the first direction. For example, the first bit line BL0 may be alternately connected to drains or sources of an access transistor T connected to the first source line SL0 and an access transistor T connected to the second source line SL1 in the first direction. Here, the bit lines BL 150 may be considered as being connected to the drains or sources of the corresponding access transistors T through corresponding memories M.

When one of the plurality of word lines WL 120 and one of the plurality of source lines SL 130 or the plurality of bit lines BL 150 are selected based on such a connection relationship, only one memory cell C may be selected. For example, when the third word line WL2 and the third source line SL2 or the third bit line BL2 are selected, a memory cell Cs arranged between the second word line WL1 and the third word line WL2 and between the third source line SL2 and the third bit line BL2 may be selected.

For reference, due to characteristics of the magnetic memory device, when one word line and one bit line are selected, a corresponding source line may be automatically determined. To the contrary, when one word line and one source line are selected, a corresponding bit line may be automatically determined. On the other hand, in FIG. 1, only first to seventh word lines WL0 to WL6, the first to fourth source lines SL0 to SL3, and the first to third bit lines BL0 to BL2 are exemplarily illustrated. For example, when the memory cell array is divided in units of blocks along column source lines CSL, eight word lines, eight source lines, and eight bit lines may be arranged in one block.

The access transistors T that form the memory cells C may be turned on or off in accordance with voltages of the word lines WL 120 to control current supply to the memories M. For example, the access transistors T may be metal-oxide-semiconductor (MOS) transistors or bipolar transistors. In addition, the memories M that form the memory cells C may include magnetic materials. For example, the memories M may include magnetic tunnel junction (MTJ) devices. The memories M may function as memories using a spin transfer torque (STT) phenomenon in which a magnetization direction of the magnetic materials is changed by input current.

For reference, the magnetic memory device, for example, a magnetic random access memory (MRAM) will be briefly described. In order to store states "0" and "1" in the MTJ devices that are memory devices included in the magnetic memory device, currents that flow through the MTJ devices must be bidirectional. That is, the current that flows through the MTJ devices when data "0" is recorded must be opposite to the current that flows through the MTJ devices when data "1" is recorded. In order to form a structure in which currents of opposite directions flow, in the magnetic memory device, the source lines other than the bit lines exist. The bit lines and the source lines change respective potential differences with the MTJ devices and the access transistors (or cell transistors) of the memory cell interposed so that the directions of the currents that flow through the MTJ devices of the respective memory cells may be selected.

A conventional method of operating the source lines of the magnetic memory device is divided into a method of using a shared source line and a method of using separate source lines. In the method of using the shared source line, since a source line is shared by all the memory cells, it is advantageous in terms of an area. However, since a reference voltage is applied to the source line and voltages lower and higher than the reference voltage must be applied to each of the bit lines in order to store data, an operating voltage is increased. On the other hand, in the method of using the separate source lines, since voltages of the bit lines and the source lines may be exchanged to be used, an operating voltage may be reduced. However, since the source lines must be formed to correspond to the respective bit lines, it is disadvantageous in terms of an area, that is, density.

However, the magnetic memory device according to the inventive concepts may have a memory cell array structure capable of reducing or minimizing a size of unit memory cells while applying the method of using the separate source lines. That is, as illustrated in FIG. 1, the memory cell array may be designed so that one source line is arranged in one bit line.

Therefore, like in the conventional method of using the separate source lines, the voltages of the bit lines and the source lines may be exchanged to be used so that the operating voltage may be reduced.

In addition, since the memory cells are arranged so that two source lines share one bit line, the memory cells may be arranged in zigzags along the word lines WL 120 and the source lines SL 130 or the bit lines BL 150. Therefore, the size of the unit memory cells may be reduced or minimized.

For example, the magnetic memory device according to the inventive concepts may have a unit memory cell Cu marked with a rectangular dotted line. Specifically, when a pitch between the word lines WL 120 is 2F and a pitch between the source lines SL 130 or the bit lines BL 150 is 4F, the size of the unit memory cell Cu may be $8F^2$. Here, F may mean a minimum lithographic feature size.

On the other hand, the memory cells are arranged in zigzags along the word lines WL 120 and the source lines SL 130 or the bit lines BL 150 and are connected by the word lines WL 120, the source lines SL 130, and the bit lines BL 150 as illustrated in FIG. 1 so that one word line and one bit line (or one source line) are selected and only one memory cell may be selected.

Figure 2A:
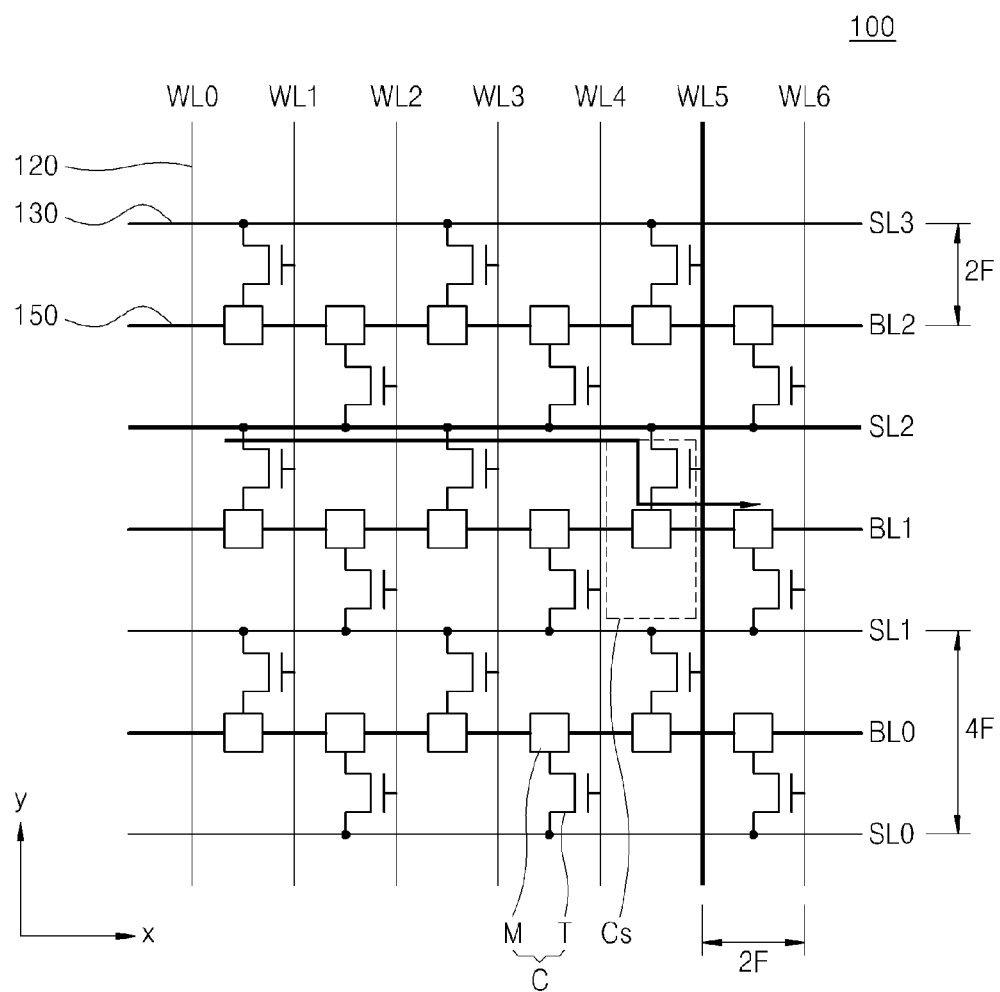
FIGS. 2A and 2B are conceptual views illustrating a principle by which data items "0" and "1" are recorded in the magnetic memory device of FIG. 1.
Figure 2B:
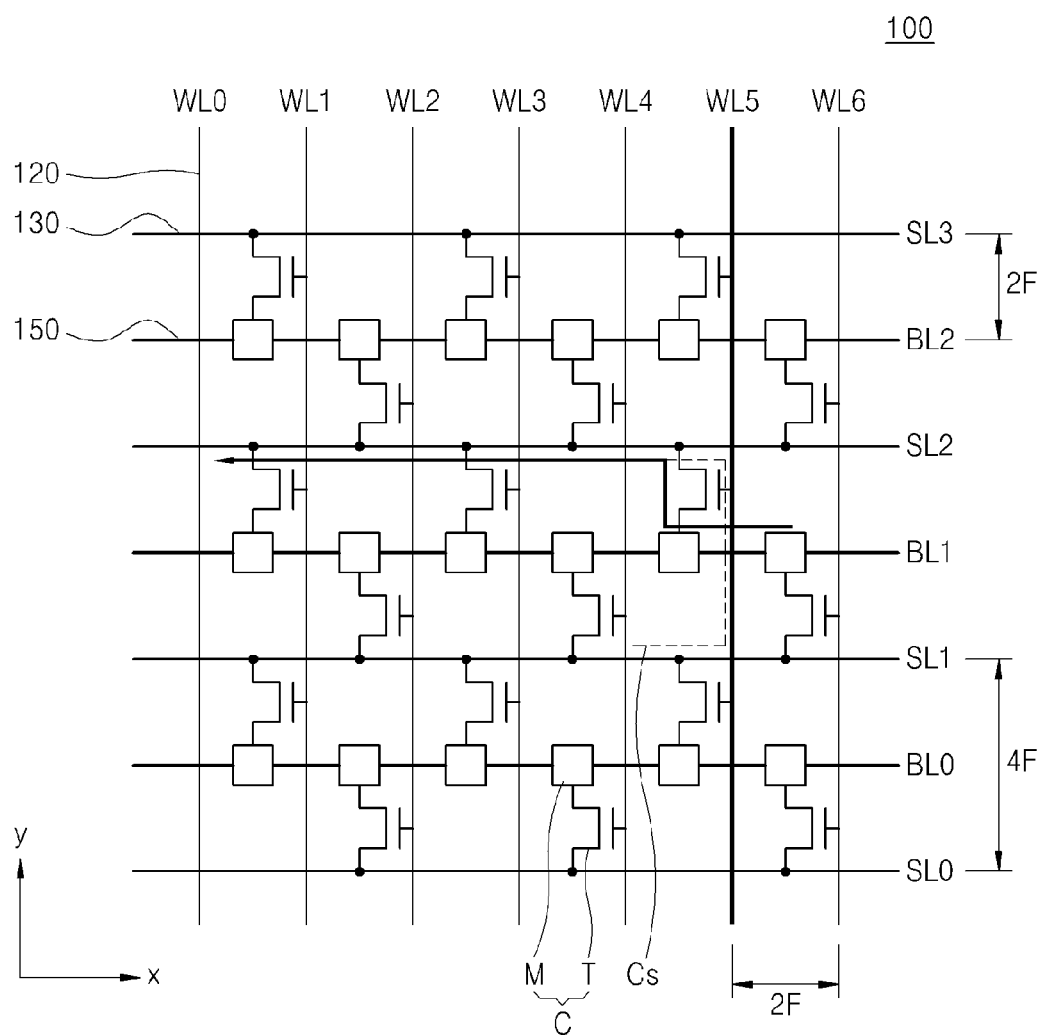

FIGS. 2A and 2B are conceptual views illustrating a principle by which data items "0" and "1" are recorded in the magnetic memory device of FIG. 1.

Referring to FIG. 2A, when data "0" is to be recorded in a selected memory cell Cs marked with a rectangular dotted line, first, when the sixth word line WL5 and the second bit line BL1 (or the third source line SL2) are selected, the selected memory cell Cs may be uniquely determined. A high voltage is applied to the third source line SL2, a low voltage is applied to the second bit line BL1, and an appropriate turn-on voltage is applied to the sixth word line WL5 so that a current path marked with an arrow is generated and the data "0" may be recorded in an MTJ device of the selected memory cell Cs. Here, the high voltage applied to the third source line SL2 may be 1.2V and the low voltage applied to the second bit line BL1 may be 0V. However, the high voltage and the low voltage are example numerical values and the high voltage applied to the source line and the low voltage applied to the bit line are not limited to the above numerical values.

Referring to FIG. 2B, when data "1" is to be recorded in the selected memory cell Cs, in the same method, the sixth word line WL5 and the second bit line BL1 (or the third source line SL2) are selected so that the selected memory cell Cs may be determined. A low voltage is applied to the third source line SL2, a high voltage is applied to the second bit line BL1, and an appropriate turn-on voltage is applied to the sixth word line WL5 so that a current path marked with an arrow is generated and the data "1" may be recorded in the MTJ device of the selected memory cell Cs. Here, the low voltage applied to the third source line SL2 may be 0V and the high voltage applied to the second bit line BL1 may be 1.2V. That is, the voltages applied when the data "0" is recorded may be exchanged to record the data "1". Therefore, in the memory cell array structure according to the present embodiment, data may be recorded in the MTJ device with a low operating voltage of about 1.2V. As described when the data "0" is recorded, since the high voltage and the low voltage are only example numerical values, a high voltage and a low voltage with other numerical values may be applied.

For reference, in FIGS. 2A and 2B, thick lines represent that a higher voltage than 0V is applied and remaining thin lines represent that the voltage 0V is applied, that is, no voltage is applied. Therefore, it is noted that a predetermined voltage is applied to the third source line SL2 when the data "0" is recorded and a predetermined voltage is applied to the second bit line BL1 when the data "1" is recorded.

As described above, in the memory cell array structure according to the present embodiment, since only one memory cell may be selected in both directions, it is possible to prevent a memory cell from being repeatedly selected so that design coding may be easily performed.

Figure 3:
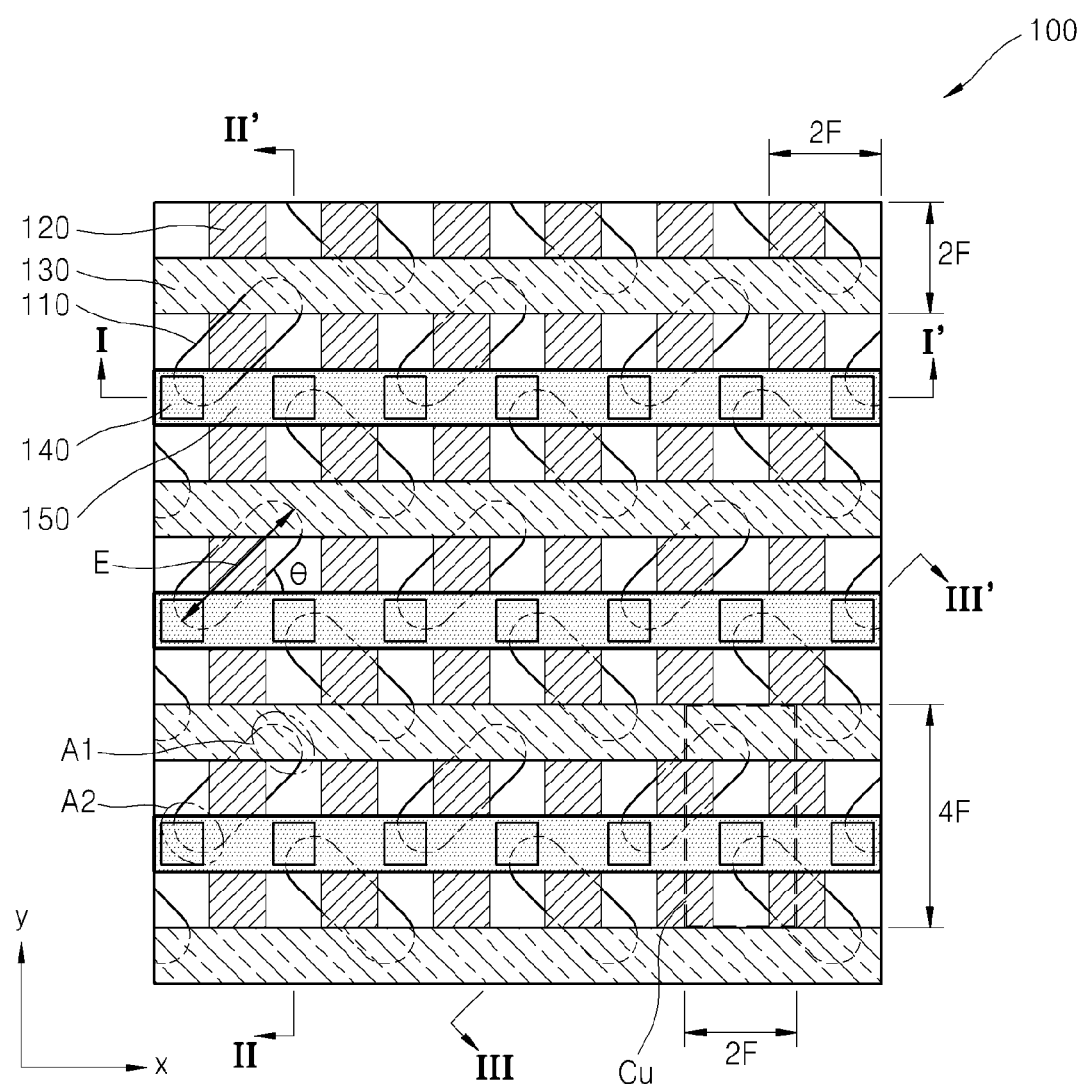
FIG. 3 illustrates a layout of a magnetic memory device according to an embodiment of the inventive concepts.

FIG. 3 illustrates a layout of a magnetic memory device according to an embodiment of the inventive concepts, which may correspond to the memory cell array of the magnetic memory device 100 of FIG. 1.

Referring to FIG. 3, the magnetic memory device 100 may include a plurality of memory cells (C of FIG. 1) arranged in a matrix. In addition, the magnetic memory device 100 may include active regions 110, word lines 120, source lines 130, variable resistance structures 140, and bit lines 150.

The active regions 110 may be defined on a substrate by an isolation film. For example, the active regions 110 extend in an extension direction E marked with a bidirectional arrow and may be arranged at an oblique angle in a first direction (an x direction). For example, the active regions 110 may be arranged at a first angle θ corresponding to an acute angle in the first direction. In addition, as the active regions 110 are arranged at the oblique angle in the first direction, the active regions 110 may be arranged at the oblique angle in a second direction (a y direction) vertical to the first direction.

Each of the active regions 110 may include a first region A1 and a second region A2 at both ends thereof. The first regions A1 connected to the source lines 130 may partially overlap the source lines 130. The first regions A1 may be source or drain regions in terms of transistors. The second regions A2 connected to the bit lines 150 may partially overlap the bit lines 150. The second regions A2 may be drain or source regions in terms of transistors. On the other hand, the second regions A2 of the active regions 110 may be connected to the bit lines 150 through the variable resistance structures 140.

The plurality of active regions 110 may be arranged in parallel in the first and second directions as illustrated in FIG. 3. In addition, first line active regions 110 arranged along one word line 120 in the second direction may be arranged so that an extension direction E thereof intersects that of second line active regions 110 arranged along a word line 120 adjacent to the one word line 120. For example, the first line active regions 110 may be arranged so that the extension direction E thereof intersects that of the second line active regions 110 at right angle.

Similarly, first group active regions 110 arranged between one bit line 150 and a source line 130 adjacent to the one bit line 150 above the one bit line 150 in the second direction may be arranged so that an extension direction E thereof intersects that of second group active regions 110 arranged between the one bit line 150 and a source line 130 adjacent to the one bit line 150 below the one bit line 150 in the second direction. For example, the first group active regions 110 may be arranged so that the extension direction E thereof intersects that of the second group active regions 110 at right angle.

The active regions 110 may be formed of a semiconductor material layer that forms the substrate or a semiconductor material layer separately formed on the substrate. For example, the active regions 110 may be formed of a silicon layer formed on the substrate through deposition or epitaxial growth. The silicon layer may be, for example, a single crystal silicon layer or a polysilicon layer.

The plurality of word lines 120 may be arranged in parallel in the first direction while extending in the second direction. As illustrated in FIG. 3, the plurality of word lines 120 may be arranged across the active regions 110 arranged in the second direction. For example, the plurality of word lines 120 may be arranged across central portions between the first regions A1 and the second regions A2 of the corresponding active regions 110 arranged in the second direction, respectively.

The word lines 120 may include at least one material among a doped semiconductor, a metal, a conductive metal nitride, and a metal-semiconductor compound. On the other hand, a pitch between the word lines 120 in the first direction may be 2F.

The plurality of source lines 130 may be arranged in parallel in the second direction while extending in the first direction. The plurality of source lines 130 may be arranged to overlap parts of the first regions A1 of the plurality of active regions 110, respectively, and may be electrically connected to the first regions A1. For example, in each of the plurality of source lines 130, the first group active regions 110 arranged between the source line 130 and a bit line 150 adjacent to the source line 130 below the source line 130 in the second direction and the second group active regions 110 arranged between the source line 130 and a bit line 150 adjacent to the source line 130 above the source line 130 in the second direction may be arranged. The first regions A1 of the first group active regions 110 and the second group active regions 110 may be commonly and electrically connected to one source line 130.

In addition, in the first direction, the first group active regions 110 and the second group active regions 110 may intersect different word lines 120, respectively. Therefore, only one active region 110 among all the active regions included in the first group active regions 110 and the second group active regions 110 may be selected by selecting one word line 120.

The source lines 130 may include at least one material among a metal, a conductive metal nitride, a metal-semiconductor compound, and a doped semiconductor. On the other hand, a pitch between the source lines 130 in the second direction may be 4F.

The plurality of variable resistance structures 140 may be arranged to correspond to the plurality of active regions 110 in the first and second directions. The variable resistance structures 140 may be arranged below the bit lines 150 to be connected to the second regions A2 of the active regions 110 connected to the bit lines 150. That is, the variable resistance structures 140 may be arranged to correspond to the plurality of active regions 110, respectively, and may be electrically connected to the second regions A2 of the plurality of active regions 110, respectively.

A structure and material of the variable resistance structures 140 will be described in detail with reference to FIG. 6.

The plurality of bit lines 150 may be arranged in parallel in the second direction while extending in the first direction like the source lines 130. The plurality of bit lines 150 may be arranged to alternate with the plurality of source lines 130 in the second direction. The plurality of bit lines 150 may be arranged to overlap parts of the second regions A2 of the plurality of active regions 110, respectively, and may be electrically connected to the second regions A2. The plurality of bit lines 150 may be electrically connected to the second regions A2 of the plurality of active regions 110, respectively, through the variable resistance structures 140 arranged therebetween.

In each of the plurality of bit lines 150, third group active regions 110 arranged between the bit line 150 and a source line 130 adjacent to the bit line 150 below the bit line 150 in the second direction and fourth group active regions 110 arranged between the bit line 150 and a source line 130 adjacent to the bit line 150 above the bit line 150 in the second direction may be arranged. The second regions A2 of the third group active regions 110 and the fourth group active regions 110 may be commonly and electrically connected to one bit line 150 through corresponding variable resistance structures 140.

In addition, in the first direction, the third group active regions 110 and the fourth group active regions 110 may intersect different word lines 120, respectively. Therefore, only one active region 110 among all the active regions included in the third group active regions 110 and the fourth group active regions 110 may be selected by selecting one word line 120. For reference, the third group active regions 110 may correspond to the second group active regions 110 described above in the source line 130 and the fourth group active regions 110 may correspond to the first group active regions 110 described above in the source line 130. This is because, based on one source line 130, above the one source line 130 in the second direction corresponds to, based on a bit line 150 adjacent to the one source line 130, below the bit line 150 in the second direction. Similarly, based on one source line 130, below the one source line 130 in the second direction corresponds to, based on a bit line 150 adjacent to the one source line 130, above the bit line 150 in the second direction.

The bit lines 150 may include at least one material among a metal, a conductive metal nitride, a metal-semiconductor compound, and a doped semiconductor. On the other hand, a pitch between the bit lines 150 in the second direction may be 4F.

On the other hand, a dotted rectangle may mean a unit memory cell Cu. The unit memory cell Cu may have a size of $8F^2$. For reference, when the unit memory cell Cu is defined to include one access transistor (T of FIG. 1) and one variable resistance structure 140 like in FIG. 1, in the layout of the present embodiment, it is very difficult to define the unit memory cell Cu to fully include one active region 110 that forms an access transistor and it may be difficult to calculate the size of the unit memory cell Cu. Therefore, when the unit memory cell Cu is defined as illustrated in FIG. 3, two active regions 110 each of which is about ½ are included in one unit memory cell Cu so that it may be considered that one active region 110 is included. The word lines, the source lines, and the bit lines may be included in the unit memory cell by a similar concepts. For example, two word lines each of which is about ½ may be included in the unit memory cell Cu.

Figure 4A:
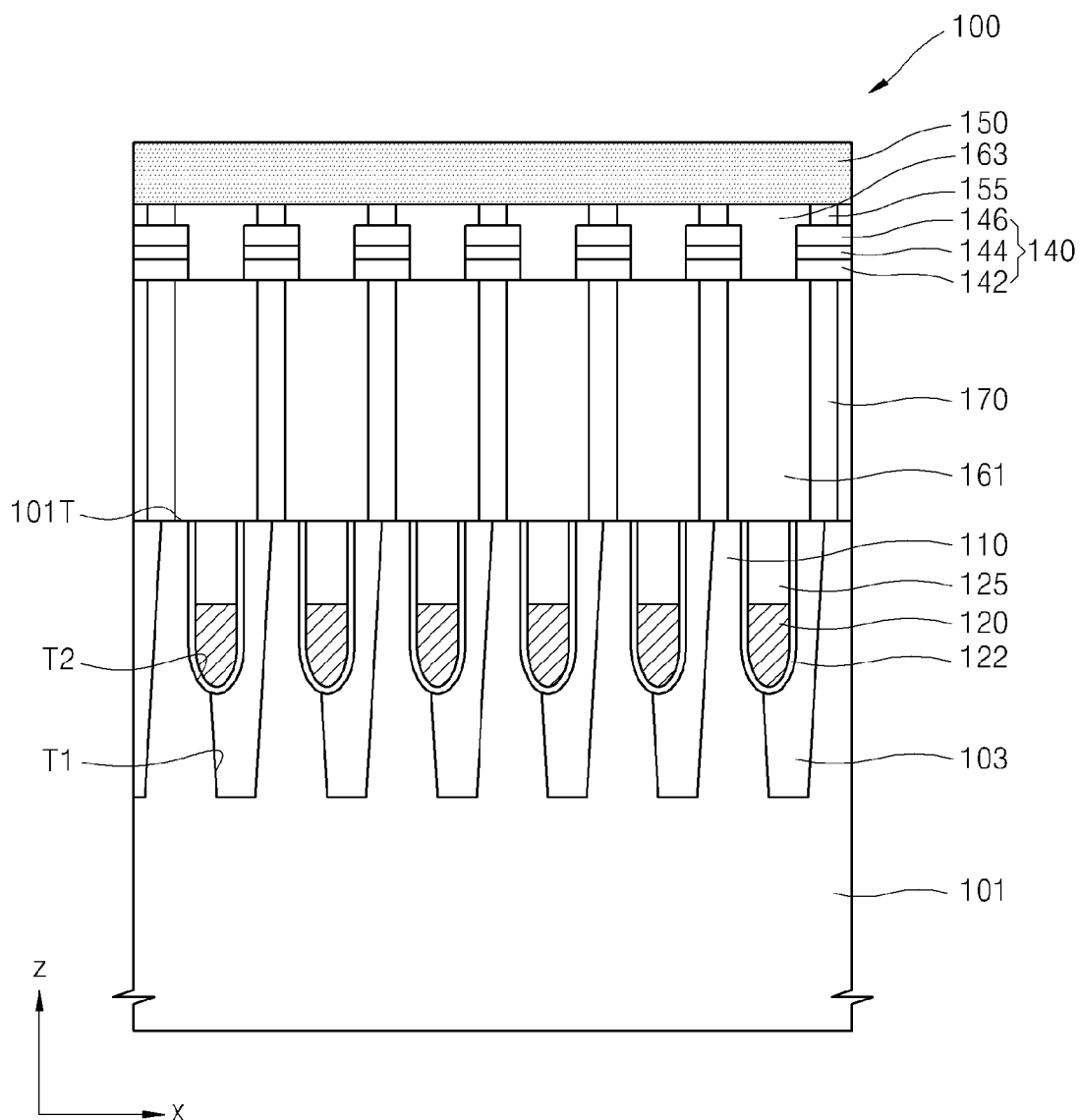
FIGS. 4A to 4C are cross-sectional views taken along lines I-I', II-II', and III-III' of FIG. 3.
Figure 4B:
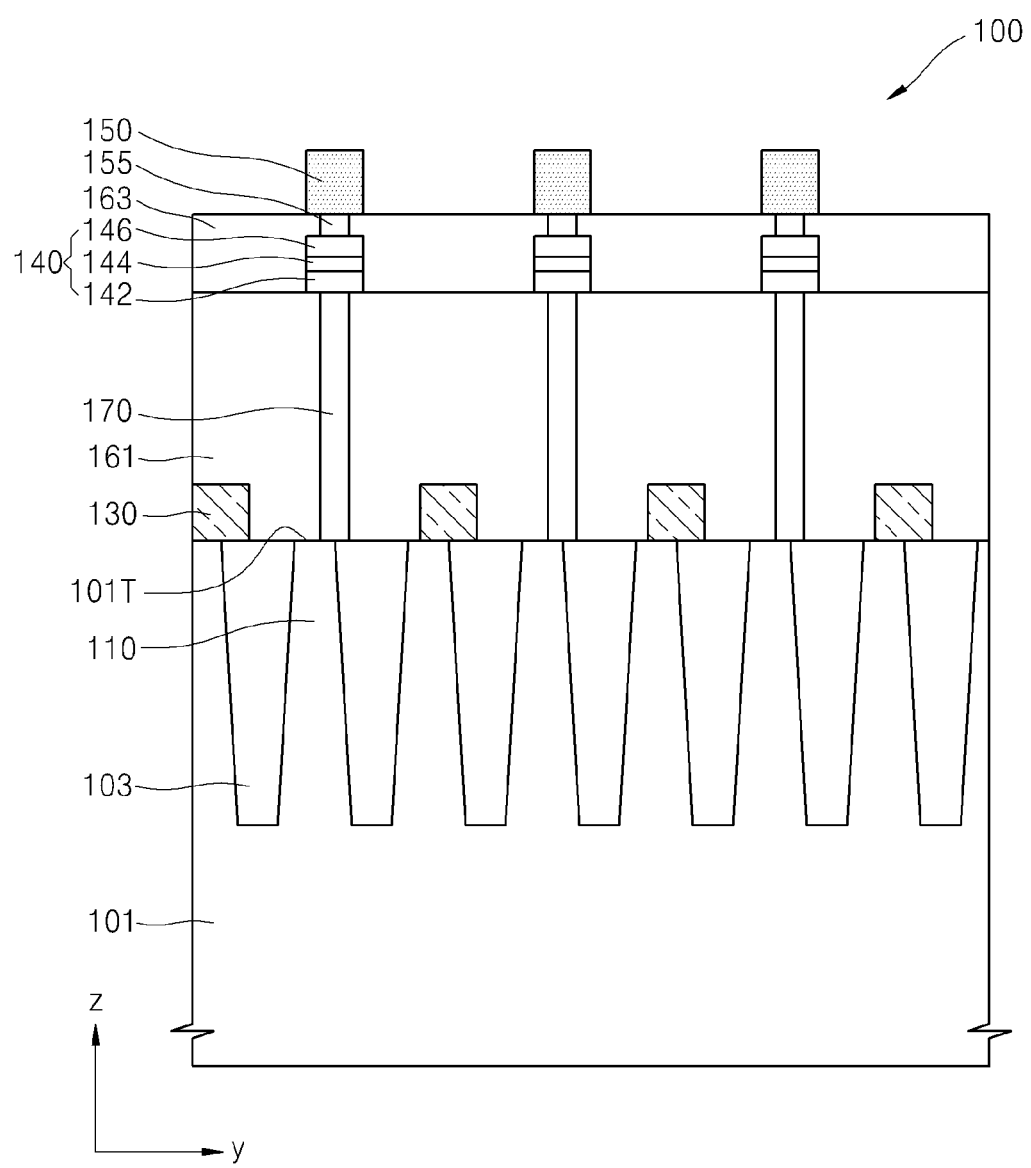
Figure 4C:
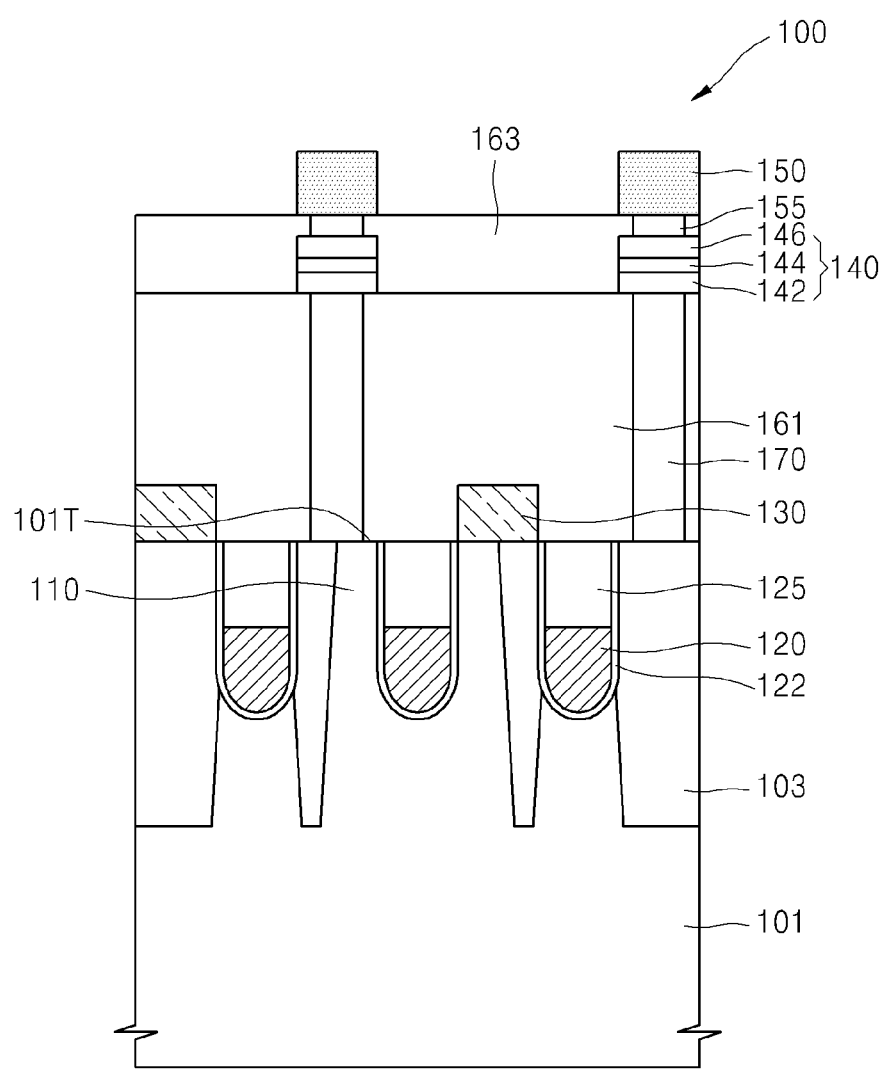

FIGS. 4A to 4C are cross-sectional views taken along lines I-I', II-II', and III-III' of FIG. 3.

Referring to FIGS. 4A to 4C, the magnetic memory device 100 may include a substrate 101 in which an isolation film 103 is formed. The plurality of active regions 110 that extend in parallel at an oblique angle with respect to the first direction (the x direction) may be defined on the substrate 101 by the isolation film 103 (refer to FIG. 3). The isolation film 103 may be formed in isolation trenches T1 formed in the substrate 101.

The substrate 101 may be formed of a semiconductor material. In some embodiments, the substrate 101 may include silicon (Si). In other embodiments, the substrate 101 may include a semiconductor element such as germanium (Ge) or a compound semiconductor material such as silicon carbide (SiC), gallium arsenide (GaAs), indium arsenide (InAs), and indium phosphide (InP). In some embodiments, the substrate 101 may have a silicon on insulator (SOI) structure. For example, the substrate 101 may include a buried oxide layer (BOX). In some embodiments, the substrate 101 may include a conductive region, for example, a well doped with impurities or a structure doped with impurities.

The plurality of word lines 120 may extend on the plurality of active regions 110 in the second direction (the y direction of FIG. 3) vertical to the first direction. The plurality of word lines 120 may be arranged in parallel by a predetermined distance, for example, with the pitch of 2F in the first direction (the x direction).

As illustrated in FIGS. 4A and 4C, the plurality of word lines 120 may have upper surfaces on a lower level than that of the upper surface 101T of the substrate 101 so that the plurality of word lines 120 may be buried in the substrate 101. However, the inventive concepts is not limited thereto. For example, the word lines 120 may be formed to have upper surfaces on a higher level than that of the upper surface 101T of the substrate 101.

The plurality of word lines 120 may be formed in gate trenches T2 formed in the substrate 101. A gate dielectric film 122 for insulating the plurality of word lines 120 from the substrate 101 may be formed in the gate trenches T2. In addition, a burial insulating film 125 may be filled in the gate trenches T2 on the plurality of word lines 120.

In some embodiments, the word lines 120 may include at least one material among a doped semiconductor, a metal, a conductive metal nitride, and a metal-semiconductor compound as described above.

In some embodiments, the gate dielectric film 122 may be formed of at least one selected from a silicon oxide film, a silicon nitride film, a silicon oxynitride film, oxide/nitride/oxide (ONO), and a high-k dielectric film having a higher dielectric constant than that of the silicon oxide film.

In some embodiments, the burial insulating film 125 may include at least one material among the silicon nitride film, the silicon oxide film, and the silicon oxynitride film.

The plurality of source lines 130 may be formed on the upper surface 101T of the substrate 101 and the isolation film 103. The plurality of source lines 130 may contact the first regions (A1 of FIG. 3) of the active regions 110 to be electrically connected to the first regions of the active regions 110. The plurality of source lines 130 may be arranged in parallel in the second direction (the y direction) while extending in the first direction (the x direction) (refer to FIG. 3).

On the other hand, a metal silicide film may be formed between the plurality of source lines 130 and the active regions 110. The metal silicide film may reduce contact resistance between source/drain regions formed in the active regions 110, for example, the first regions (A1 of FIG. 3) of the active regions 110 and the source lines 130. However, the metal silicide film may be omitted and the plurality of source lines 130 may directly contact the first regions of the active regions 110 as illustrated in FIGS. 4B and 4C.

In some embodiments, the plurality of source lines 130 may have a burial structure in which the plurality of source lines 130 are lower than the upper surface 101T of the substrate 101. When the plurality of source lines 130 have the burial structure, the plurality of source lines 130 may be formed to be higher than upper surfaces of the word lines 120 considering that the source lines 130 intersect the word lines 120.

A first insulating layer 161 that covers the plurality of source lines 130 may be formed on the upper surface 101T of the substrate 101 and the isolation film 103. The first insulating film 161 may be formed of an oxide film, a nitride film, or a combination of the oxide film and the nitride film. On the other hand, the first insulating layer 161 is illustrated as having a single layer structure. However, the inventive concepts is not limited thereto and the first insulating film 161 may have a multilayer structure formed of the same material or different materials.

A plurality of contact plugs 170 that contact the second regions (A2 of FIG. 3) of the plurality of active regions 110 through the first insulating layer 161 may be formed on the upper surface 101T of the substrate 101 and the isolation film 103. The plurality of contact plugs 170 may be cylindrical. However, the inventive concepts is not limited thereto. For example, the contact plugs 170 may be polygonal pillar-shaped such as square pillar-shaped and pentagonal pillar-shaped or elliptical pillar-shaped. In addition, the contact plugs 170 may be thinner toward lower portions so that a diameter of upper portions thereof is larger than that of the lower portions.

A metal silicide film may be formed between the plurality of contact plugs 170 and the second regions of the plurality of active regions 110. The metal silicide film may reduce contact resistance between the second regions of the plurality of active regions 110, for example, the source/drain regions of the plurality of active regions 110 and the plurality of contact plugs 170. However, the metal silicide film may be omitted and, as illustrated in FIGS. 4A to 4C, the plurality of contact plugs 170 may directly contact the second regions of the active regions 110.

The plurality of variable resistance structures 140 may be arranged on the plurality of contact plugs 170. The plurality of variable resistance structures 140 may be electrically separated from each other by a second insulating film 163. The plurality of variable resistance structures 140 may be connected to the second regions of the plurality of active regions 110 through the plurality of contact plugs 170.

The plurality of variable resistance structures 140 may store data in accordance with a resistance state thereof between the bit lines 150 and the contact plugs 170, respectively. The plurality of variable resistance structures 140 may have MTJ structures, respectively.

For example, each of the plurality of variable resistance structures 140 may include a lower electrode 142, an upper electrode 146, and a resistance layer 144 arranged between the lower electrode 142 and the upper electrode 146. As illustrated in FIG. 6, the resistance layer 144 may include a first magnetization layer 144-1, a tunnel barrier layer 144-2, and a second magnetization layer 144-3, which are sequentially stacked. The variable resistance structure 140 will be described in detail with reference to FIG. 6.

Each of the plurality of variable resistance structures 140 may be arranged to vertically overlap a corresponding contact plug 170 among the plurality of contact plugs 170. Therefore, the plurality of variable resistance structures 140 and the plurality of contact plugs 170 may be regularly arranged below the bit lines 150 to correspond to the second regions of the plurality of active regions 110 in the first and second directions. That is, the plurality of contact plugs 170 may be arranged to correspond to the second regions of the plurality of active regions 110 in the first and second directions like the plurality of variable resistance structures 140 illustrated in FIG. 3.

The plurality of bit lines 150 may be formed and arranged on the plurality of variable resistance structures 140. The plurality of bit lines 150 may be arranged in parallel in the second direction (the y direction) while extending in the first direction (the x direction) and may be electrically connected to the plurality of variable resistance structures 140 through a plurality of upper contact plugs 155. The plurality of bit lines 150 may be electrically connected to the source/drain regions, for example, the second regions of the active regions 110 through the variable resistance structures 140 and the contact plugs 170.

In some embodiments, the plurality of bit lines 150 may include at least one material among a metal, a conductive metal nitride, a metal-semiconductor compound, and a doped semiconductor. For example, the plurality of bit lines 150 may include a barrier film formed of tantalum (Ta), titanium (Ti), tantalum nitride (TaN), titanium nitride (TiN), or a combination of Ta, Ti, TaN, and TiN and a metal film formed on the barrier film, for example, a Copper (Cu) film.

Figure 5A:
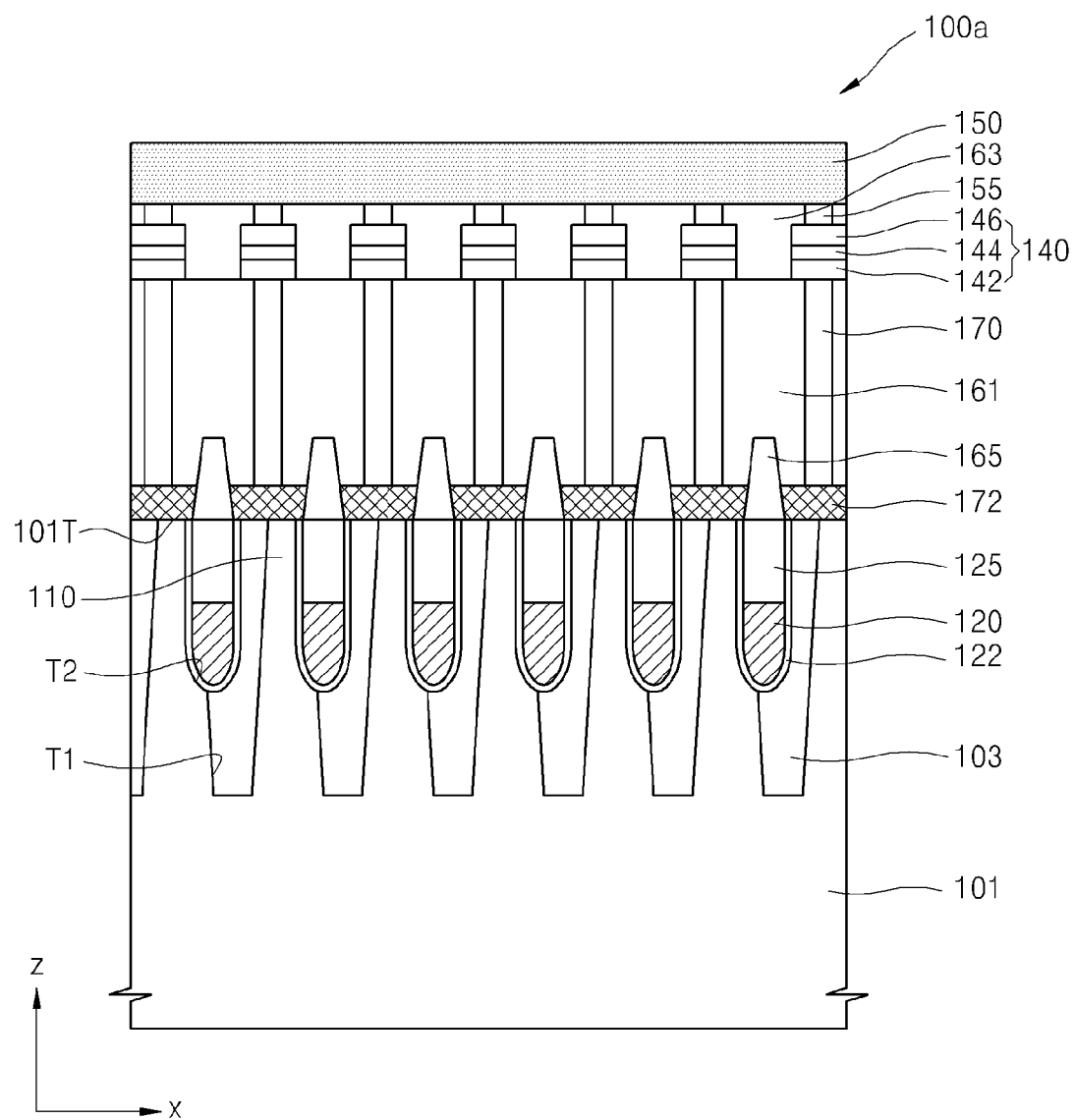
FIGS. 5A to 5C are cross-sectional views illustrating a magnetic memory device according to another embodiment of the inventive concepts, which are taken along lines I-I', II-II', and III-III' of FIG. 3.
Figure 5B:
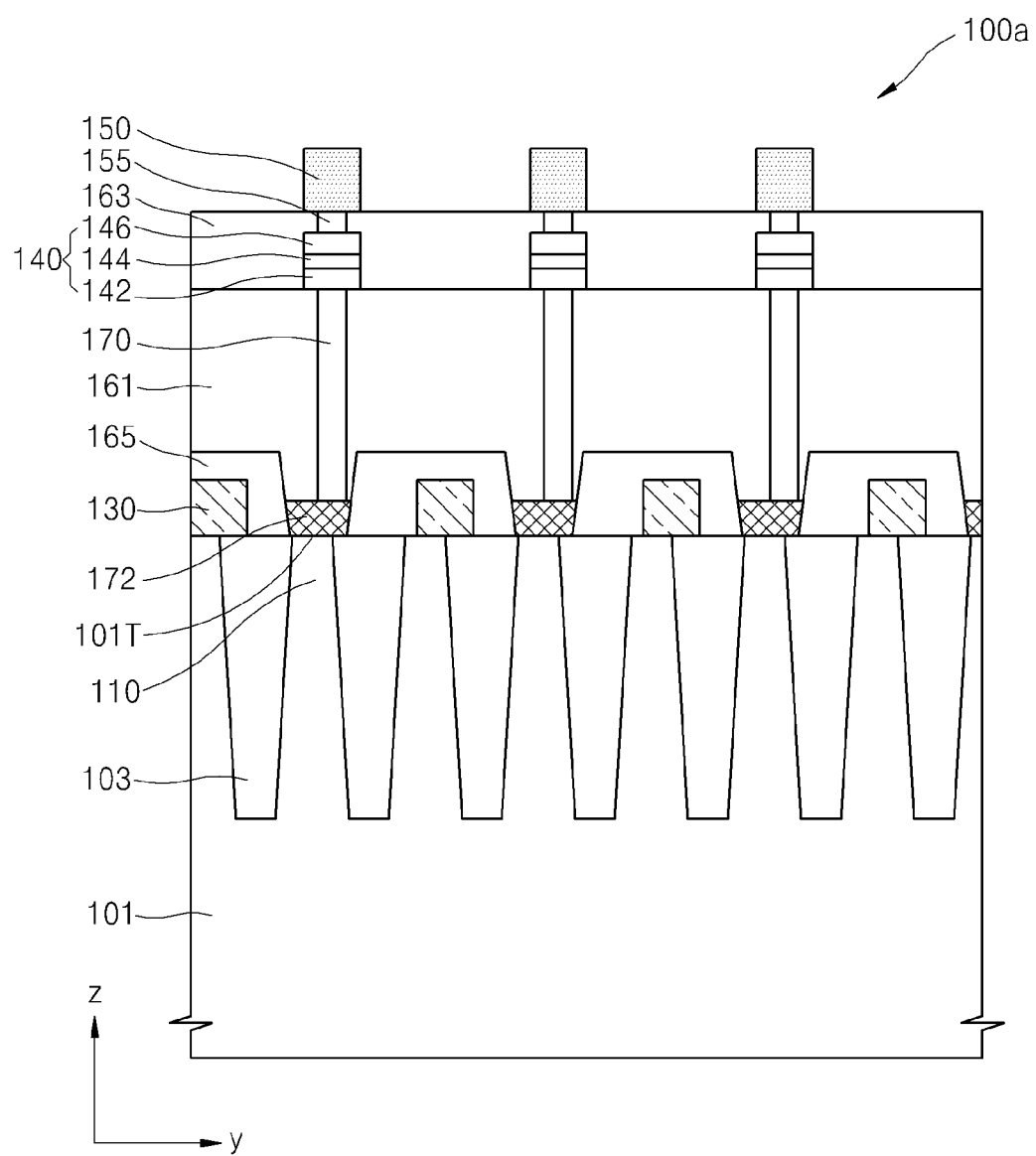
Figure 5C:
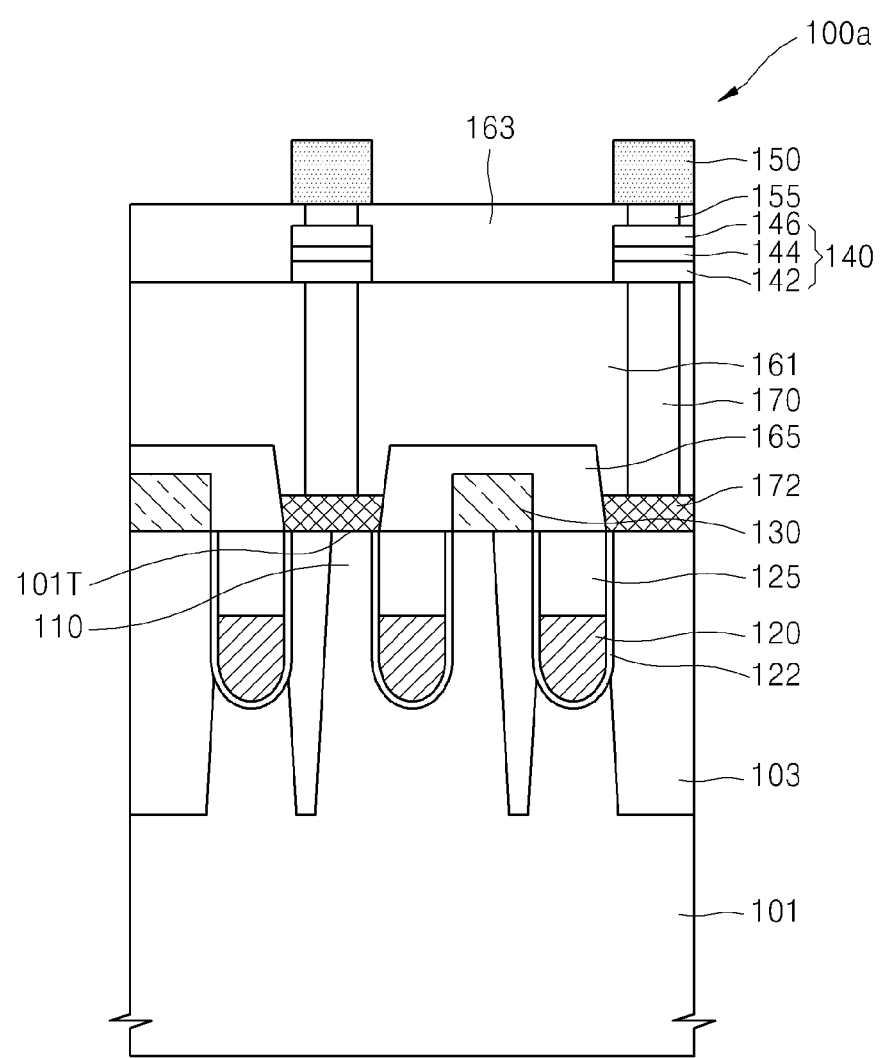

FIGS. 5A to 5C are cross-sectional views illustrating a magnetic memory device according to another embodiment of the inventive concepts, which are taken along lines I-I', II-II', and III-III' of FIG. 3. Contents previously described with reference to FIGS. 4A to 4C will be briefly described or will not be described.

Referring to FIGS. 5A to 5C, the magnetic memory device 100a according to an embodiment may have a different structure from that of the magnetic memory device 100 of FIGS. 4A to 4C in portions where the contact plugs 170 contact the active regions 110. For example, the magnetic memory device 100a according to the present embodiment may include a plurality of contact pads 172 formed between the plurality of contact plugs 170 and the plurality of active regions 110.

The plurality of contact pads 172 may be connected to the second regions of the active regions 110 through a third insulating film 165 stacked on the substrate 101. Here, the third insulating film 165 may be formed of an oxide film, a nitride film, or a combination of the oxide film and the nitride film. In an embodiment, the third insulating film 165 may have a multilayer structure formed of the same material or different materials without being limited to having a single layer structure.

On the other hand, a metal silicide film may be formed between the plurality of contact pads 172 and the plurality of active regions 110. The metal silicide film may reduce contact resistance between the second regions (2A of FIG. 3) of the plurality of active regions 110 and the plurality of contact pads 172. In an embodiment, the metal silicide film may be omitted and, as illustrated in FIGS. 5A to 5C, the plurality of contact pads 172 may directly contact the second regions of the active regions 110.

The plurality of contact plugs 170 may be formed and arranged on the plurality of contact pads 172. That is, the plurality of contact pads 172 are formed on the second regions of the plurality of active regions 110 and the plurality of contact plugs 170 are formed on the plurality of contact pads 172 so that the plurality of contact plugs 170 may be electrically connected to the second regions of the plurality of active regions 110 through the plurality of contact pads 172.

In the magnetic memory device 100a according to an embodiment, the contact pads 172 are arranged between the contact plugs 170 and the active regions 110 to reduce contact resistance between the contact plugs 170 and the active regions 110. For example, when the contact pads 172 do not exist, due to a structure or positions of the active regions 110 arranged at an oblique angle with respect to the bit lines 150, the contact plugs 170 arranged to vertically overlap the variable resistance structures 140 below the bit lines 150 may have a small contact area in which the contact plugs 170 contact the active regions 110. A contact defect may be caused between the contact plugs 170 and the active regions 110. In the magnetic memory device 100a according to an embodiment, the contact pads 172 are widely formed to contact most of the exposed active regions 110 and the contact plugs 170 may be formed so that all lower surfaces of the contact plugs 170 contact the contact pads 172. Therefore, the contact resistance between the contact plugs 170 and the active regions 110 may be significantly reduced.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 6:
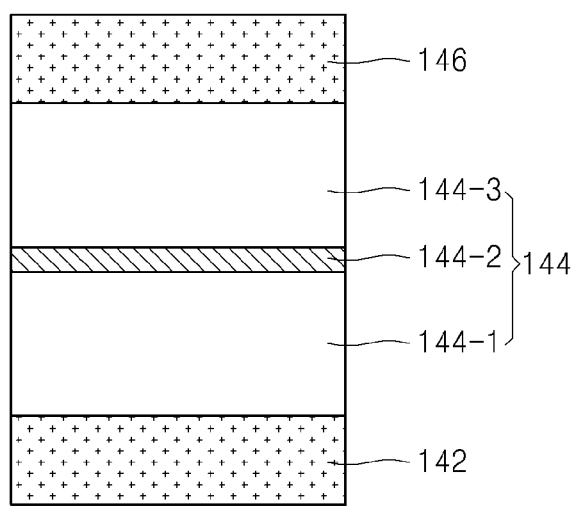
FIG. 6 is a cross-sectional view illustrating an example structure of the variable resistance structure of FIG. 3.

FIG. 6 is a cross-sectional view illustrating an example structure of the variable resistance structure of FIG. 3.

Referring to FIG. 6, the variable resistance structure 140 may include the lower electrode 142, the upper electrode 146, and the resistance layer 144 including the first magnetization layer 144-1, the tunnel barrier layer 144-2, and the second magnetization layer 144-3, which are sequentially stacked between the lower electrode 142 and the upper electrode 146. One of the first magnetization layer 144-1 and the second magnetization layer 144-3 may include a fixed layer and the other may include a free layer. However, the inventive concepts is not limited thereto. For example, the first magnetization layer 144-1 or the second magnetization layer 144-3 may include at least one fixed layer and at least one free layer. In FIG. 6, it is illustrated that one tunnel barrier layer 144-2 is included according to an embodiment. However, the inventive concepts is not limited thereto and a plurality of tunnel barrier layers may be included between the lower electrode 142 and the upper electrode 146.

A magnetization direction of the fixed layer may be fixed with a magnetization easy axis thereof vertical to a film surface. A magnetization direction of the free layer may be variable in accordance with conditions with a magnetization easy axis thereof vertical to a film surface.

A resistance value of MTJ of the variable resistance structure 140 may vary in accordance with magnetization directions of the first magnetization layer 144-1 and the second magnetization layer 144-3. For example, when the magnetization directions of the first magnetization layer 144-1 and the second magnetization layer 144-3 are antiparallel, the variable resistance structure 140 has a relatively high resistance value and the data "1" may be stored. When the magnetization directions of the first magnetization layer 144-1 and the second magnetization layer 144-3 are parallel, the variable resistance structure 140 has a relatively low resistance value and the data "0" may be stored. Data may be recorded in/read from the magnetic memory device 100 by using a difference between the resistance values.

In an embodiment, the variable resistance structure 140 may be used for implementing an MTJ device of a vertical magnetization method. In an embodiment, the magnetization direction of the free layer of the variable resistance structure 140 may be changed by a spin transfer torque (STT).

In an embodiment, the variable resistance structure 140 may have a horizontal MTJ structure in which a movement direction of current is actually vertical to the magnetization easy axis thereof.

The lower electrode 142 and the upper electrode 146 may include a conductive material with relatively small reactivity. In some embodiments, the lower electrode 142 and the upper electrode 146 may include a conductive metal nitride. For example, the lower electrode 142 and the upper electrode 146 may have a single layer structure formed of at least one material selected from Ti, Ta, ruthenium (Ru), TiN, TaN, and tungsten (W) or a multilayer structure including a plurality of materials.

The tunnel barrier layer 144-2 may have a smaller thickness than a spin diffusion distance. The tunnel barrier layer 144-2 may include a non-magnetic material. In some embodiments, the tunnel barrier layer 144-2 may comprise an oxide including at least one of magnesium (Mg), Ti, aluminium (Al), magnesium zinc (MgZn), or magnesium boron (MgB). In an embodiment, the tunnel barrier layer 144-2 may comprise a Ti nitride or a vanadium (V) nitride.

In an embodiment, at least one of the first magnetization layer 144-1 and the second magnetization layer 144-3 may include at least one of iron (Fe), cobalt (Co), nickel (Ni), palladium (Pd), or platinum (Pt). In an embodiment, at least one of the first magnetization layer 144-1 and the second magnetization layer 144-3 may comprise a Co-M1 alloy (here, M1 is at least one of Pt, Pd, or Ni) or an Fe-M2 alloy (here, M2 is at least one of Pt, Pd, or Ni). In an embodiment, at least one of the first magnetization layer 144-1 and the second magnetization layer 144-3 may further include at least one of B, carbon (C), Cu, silver (Ag), gold (Au), Ru, Ta, or chrome (Cr).

In an embodiment, at least one of the first magnetization layer 144-1 and the second magnetization layer 144-3 may include a perpendicular magnetic anisotropy (PMA) material. In an embodiment, at least one of the first magnetization layer 144-1 and the second magnetization layer 144-3 may have a synthetic anti-ferromagnetic (SAF) structure. Among ferromagnetic stacked structures, in the SAF structure, a Ru intermediate layer is inserted according to an embodiment. For example, the SAF structure may have a multilayer structure of CoFeB/Ta/(Co/Pt)m/Ru/(Co/Pd)n (here, m and n are natural numbers). The SAF structure that may be applied to the magnetic memory device according to the inventive concepts is not limited thereto and may have various modifications.

FIGS. 7A to 14B are plan views and cross-sectional views illustrating a method of forming a structure of an active region included in the layout of the magnetic memory device of FIG. 3 by a line-and-space process. Here, FIGS. 7B, 8B, 9B, 10B, 11B, 12B, 13B, and 14B are cross-sectional views taken along line IV-IV' of FIGS. 7A, 8A, 9A, 10A, 11A, 12A, 13A, and 14A.

Figure 7A:
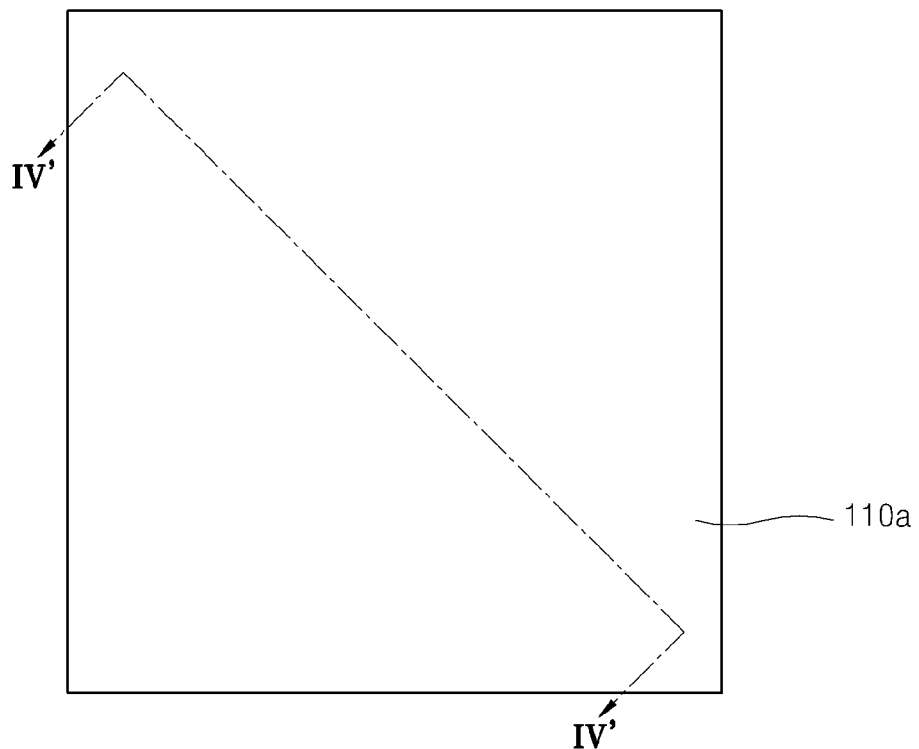
FIGS. 7A to 14B are plan views and cross-sectional views illustrating a method of forming a structure of an active region included in the layout of the magnetic memory device of FIG. 3 by a line-and-space process.
Figure 7B:
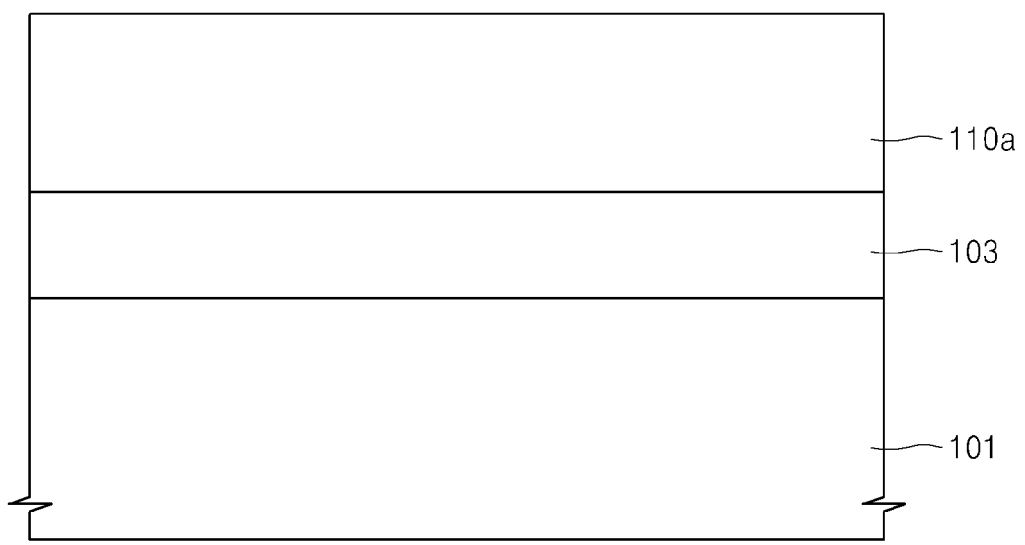

Referring to FIGS. 7A and 7B, an insulating layer 103 and a semiconductor layer 110a are sequentially formed on a substrate 101. The substrate 101 is as described with reference to FIGS. 4A to 4C. The insulating layer 103 may be formed of, for example, an oxide film, a nitride film, or a combination of the oxide film and the nitride film. In some embodiments, the insulating layer 103 may be a single layer formed of an insulating film or a multilayer formed of a combination of at least two insulating films. The insulating layer 103 may constitute a part of an isolation film in a subsequent procedure.

The semiconductor layer 110a may be, for example, a silicon layer formed on the insulating layer 103 through deposition or epitaxial growth. The silicon layer may be a single crystal silicon layer or a polysilicon layer. However, the semiconductor layer 110a is not limited to the silicon layer. For example, the semiconductor layer 110a may be formed of a semiconductor material layer of another material capable of functioning as active regions. The semiconductor layer 110a may constitute the active regions in a subsequent process. Therefore, the semiconductor layer 110a may be formed to have an appropriate thickness in consideration of a required thickness of the active regions.

Figure 8A:
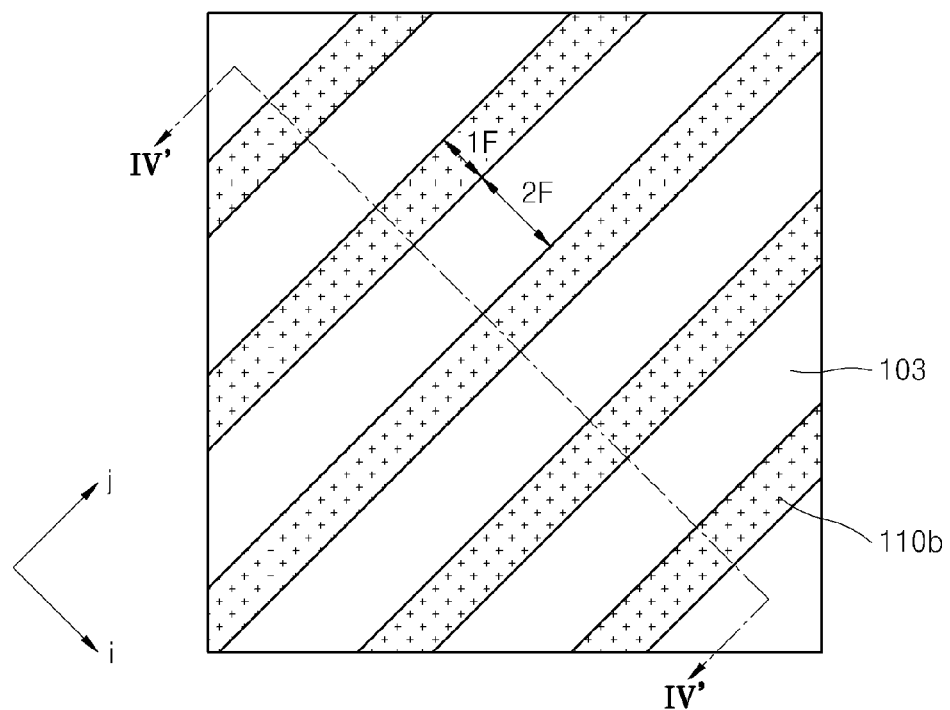
Figure 8B:
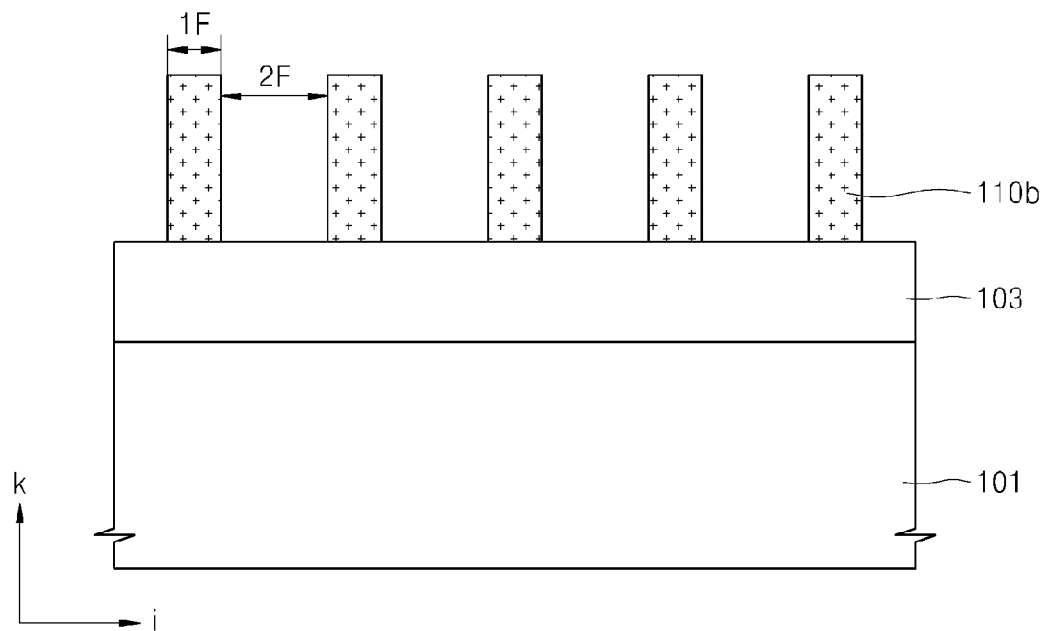

Referring to FIGS. 8A and 8B, photolithography is performed on the semiconductor layer 110a to form semiconductor pattern layers 110b that extend in a j direction and that are arranged in parallel in an i direction. Here, the jth direction or the ith direction may form an acute angle with respect to the first direction (the x direction) or the second direction (the y direction). The acute angle may be the first angle θ as illustrated in FIG. 3. For reference, a process of patterning a material layer to have lines and spaces through the photolithography is referred to as a line-and-space process.

As illustrated in FIGS. 8A and 8B, the semiconductor pattern layers 110b may be formed to have a width of 1F and a distance of 2F in the ith direction. That is, the semiconductor pattern layers 110b may be formed to have a pitch of 3F in the ith direction.

Figure 9A:
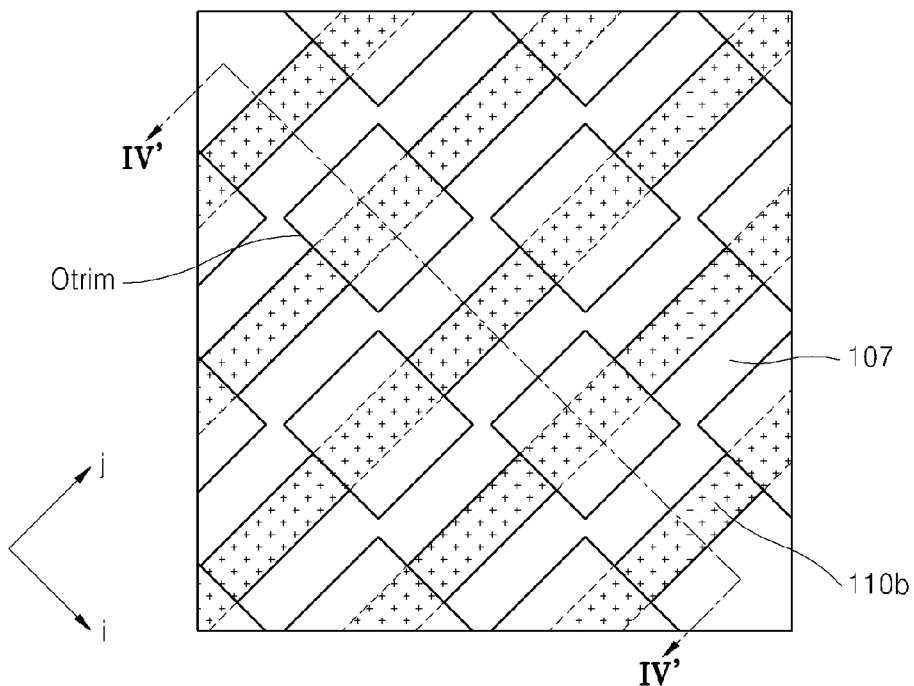
Figure 9B:
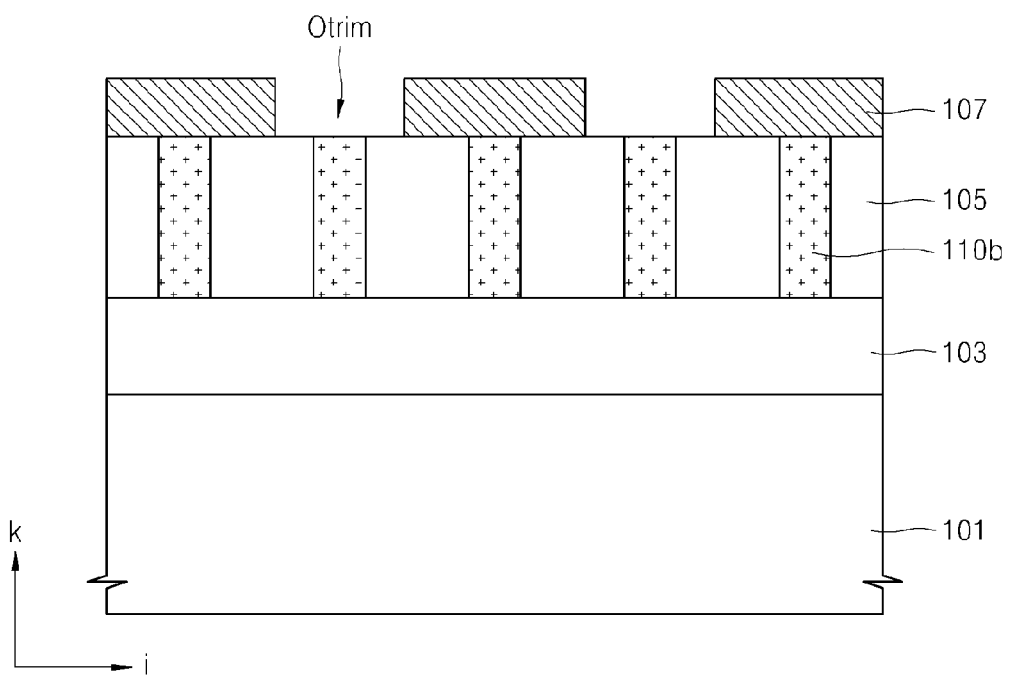

Referring to FIGS. 9A and 9B, spaces among the semiconductor pattern layers 110b are filled with a sacrificial layer 105 and mask patterns 107 for a trim process are formed on the semiconductor pattern layers 110b and the sacrificial layer 105. The mask patterns 107 may include open portions Otrim for opening portions in which trim is to be performed on the semiconductor pattern layers 110b.

The mask patterns 107 may be formed of a photoresist (PR) layer or the PR layer and a hard mask layer. In an embodiment, the sacrificial layer 105 may be formed of a material film having different etching selectivity from that of the semiconductor pattern layers 110b and a material film that may be easily removed after the trim process. For example, the sacrificial layer 105 may be formed of SOH containing a large amount of carbon or an amorphous carbon layer (ACL).

Figure 10A:
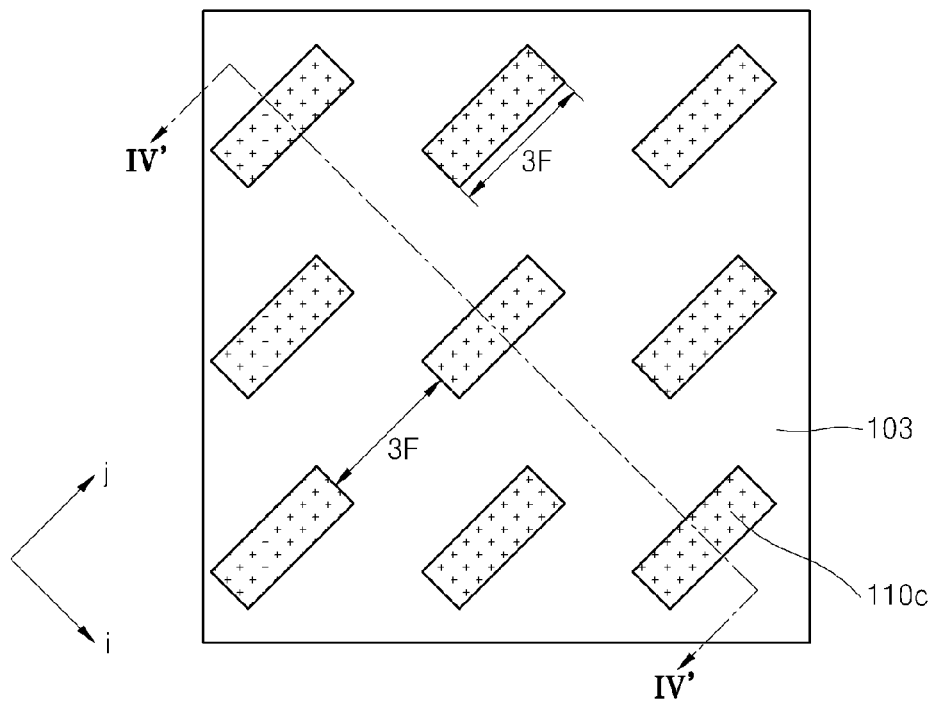
Figure 10B:
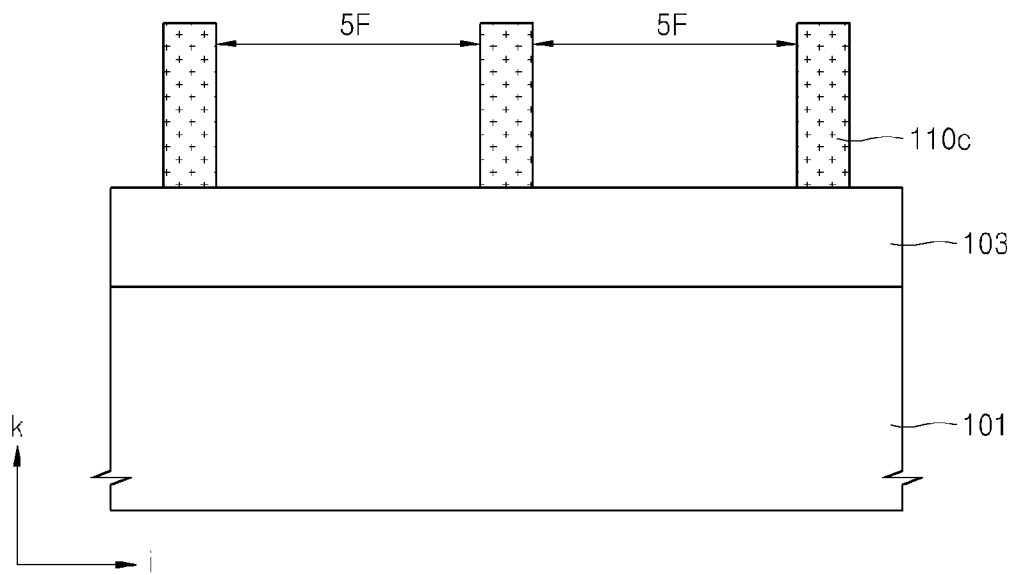

Referring to FIGS. 10A and 10B, the trim process of removing the exposed semiconductor pattern layers 110b through the photolithography is performed by using the mask patterns 107 as etching masks. After the trim process, the sacrificial layer 105 among remaining first semiconductor pattern layers 110c is removed through ashing and strip processes.

After removing the sacrificial layer 105, horizontal cross-sections of the first semiconductor pattern layers 110c may be rectangles elongated in one direction. In an embodiment, the first semiconductor pattern layers 110c may be elongated ellipses like the active regions 110 illustrated in FIG. 3 rather than the rectangles due to characteristics of the photolithography.

After the trim process, a distance between the first semiconductor pattern layers 110c in the ith direction may be 5F. In an embodiment, a length of long sides of the first semiconductor pattern layers 110c may be 3F and a distance between the first semiconductor pattern layers 110c in the jth direction may be 3F.

Figure 11A:
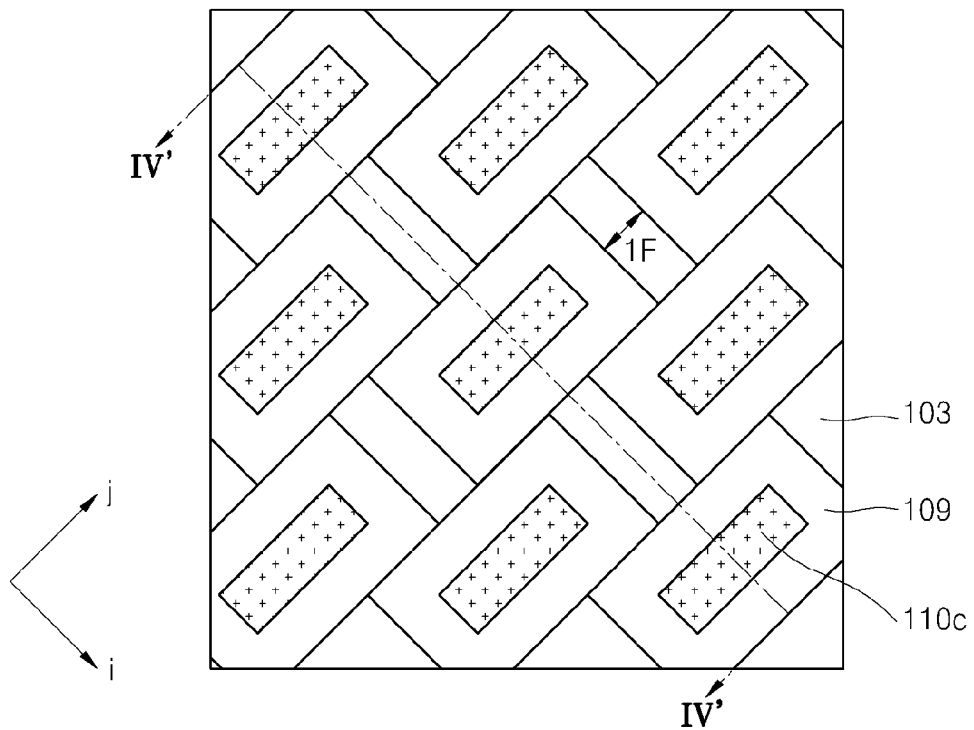
Figure 11B:
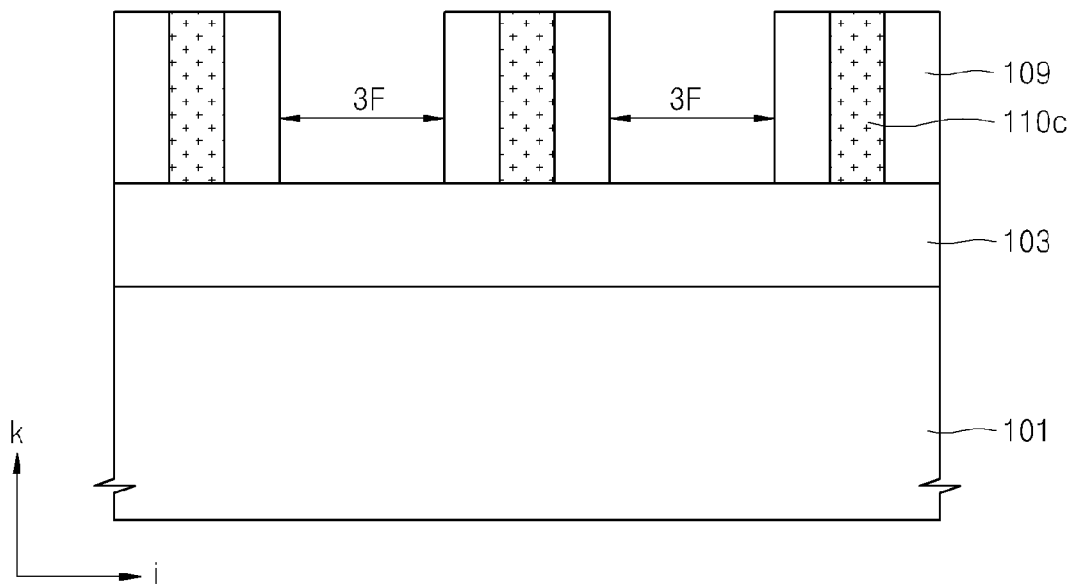

Referring to FIGS. 11A and 11B, spacers 109 are formed on side walls of the first semiconductor pattern layers 110c through an atomic layer deposition (ALD) process and an etch-back process. In an embodiment, a spacer layer is formed on the first semiconductor pattern layers 110c to have a uniform thickness, for example, a thickness of 1F. The spacer layer may be formed of an oxide layer such as a medium temperature oxide (MTO).

To form the spacer layer to have the uniform thickness, the ALD process may be used. After forming the spacer layer, the etch-back process is performed on the spacer layer until upper surfaces of the first semiconductor pattern layers 110c are exposed to form the spacers 109 that cover the side walls of the first semiconductor pattern layers 110c. After forming the spacers 109, a distance between the spacers 109 of the adjacent first semiconductor pattern layers 110c in the ith direction may be 3F. In an embodiment, a distance between the spacers 109 of the adjacent first semiconductor pattern layers 110c in the jth direction may be 1F.

Figure 12A:
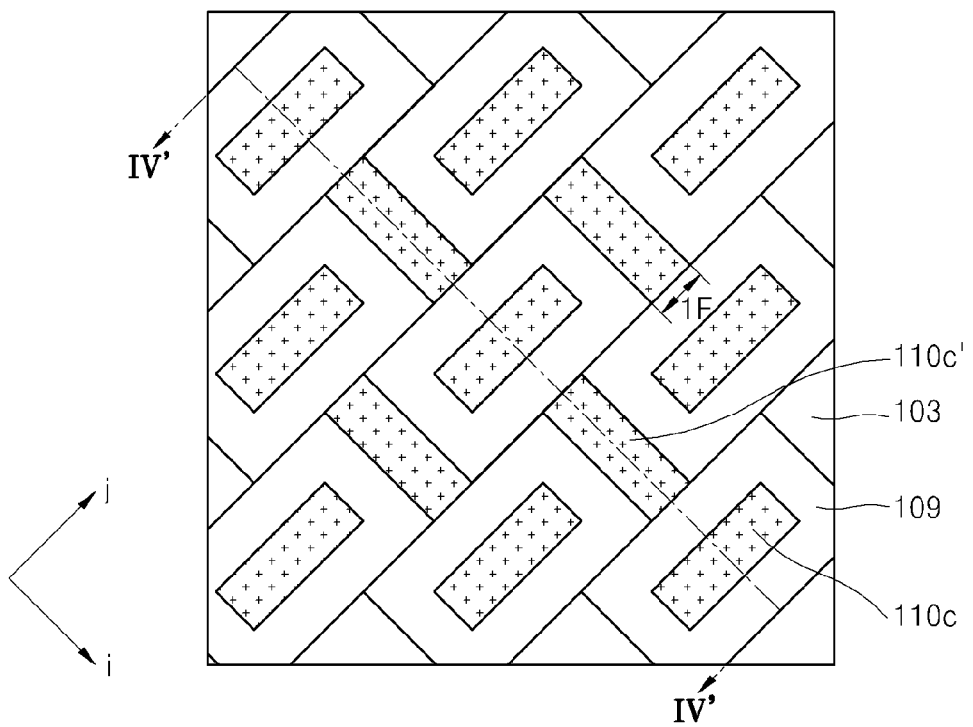
Figure 12B:
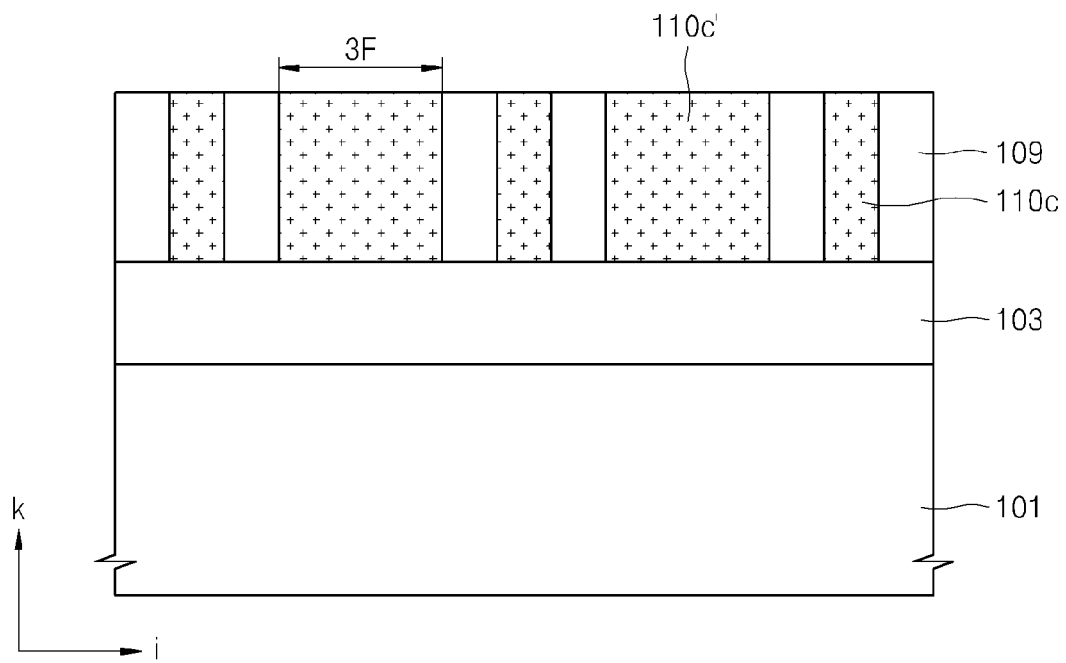

Referring to FIGS. 12A and 12B, after forming the spacers 109, spaces among the first semiconductor pattern layers 110c are filled with a semiconductor material layer 110c' of the same material as that of the first semiconductor pattern layers 110c. For example, the spaces among the first semiconductor pattern layers are filled with a silicon layer through deposition or epitaxial growth.

Since a length of the spaces among the first semiconductor pattern layers 110c is 3F in the ith direction and is 1F in the jth direction as described above, a size of the semiconductor material layer 110c' filled in the spaces among the first semiconductor pattern layers 110c may be 3F in the ith direction and may be 1F in the jth direction. That is, the semiconductor material layer 110c' may have a horizontal cross-section with the same size as that of the horizontal cross-sections of the first semiconductor pattern layers 110c.

Figure 13A:
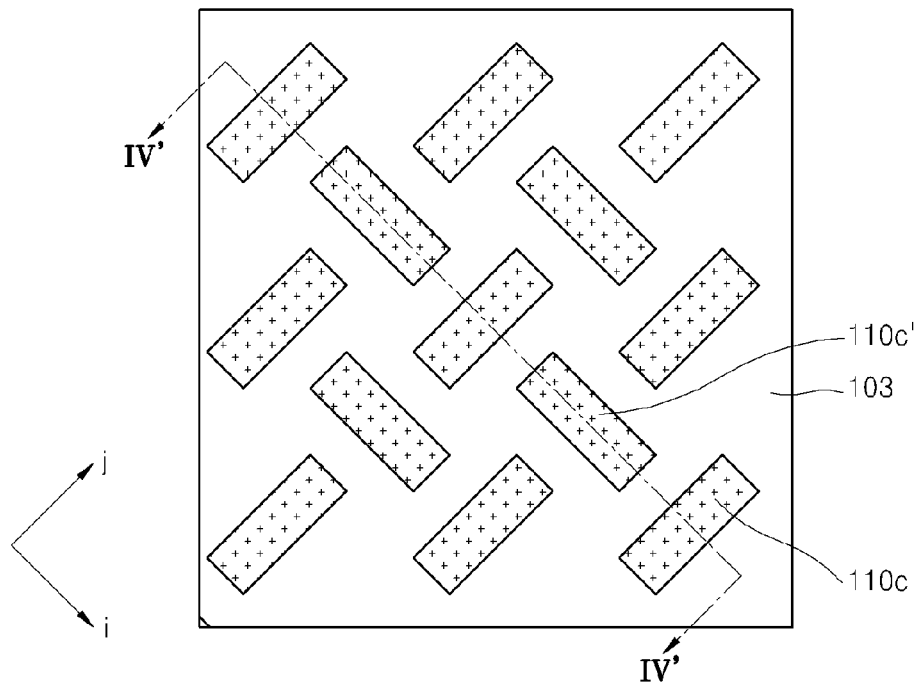
Figure 13B:
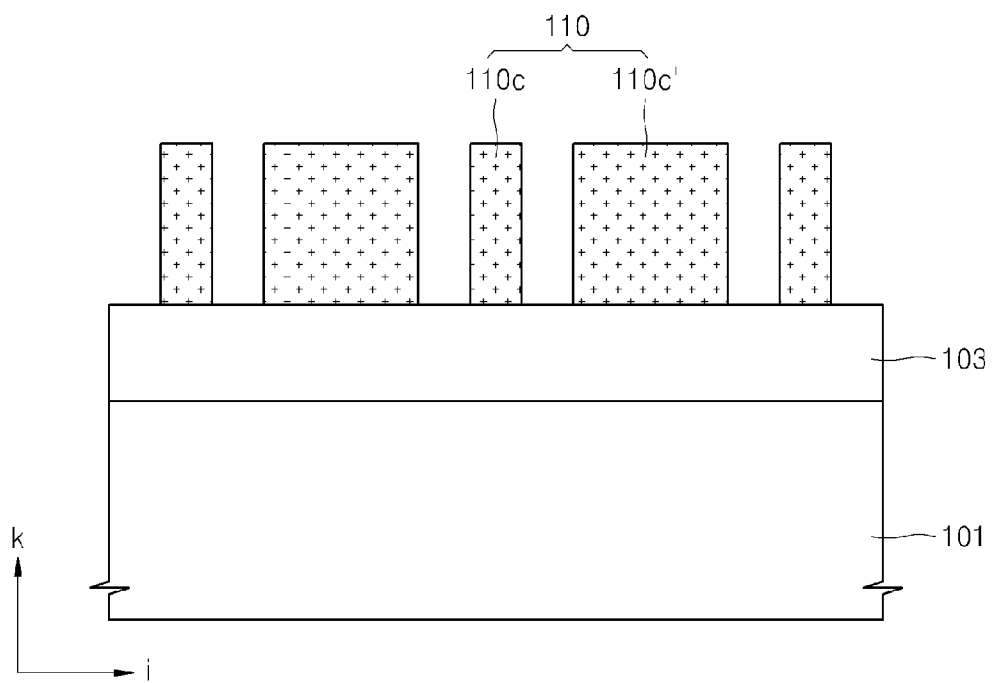

Referring to FIGS. 13A and 13B, after forming the semiconductor material layer 110c', the spacers 109 are removed to form the active regions 110 of the shape illustrated in FIG. 3. That is, after removing the spacers 109, the remaining first semiconductor pattern layers 110c and semiconductor material layer 110c' may form the active regions 110. Since the first semiconductor pattern layers 110c and the semiconductor material layer 110c' are formed of the same material and have the horizontal cross-sections with the same size as described above, the first semiconductor pattern layers 110c and the semiconductor material layer 110c' may be considered as one material layer. In an embodiment, it is noted from FIG. 13A that a pattern structure of the first semiconductor pattern layers 110c and the semiconductor material layer 110c' is the same as that of the active regions 110 illustrated in FIG. 3A.

Figure 14A:
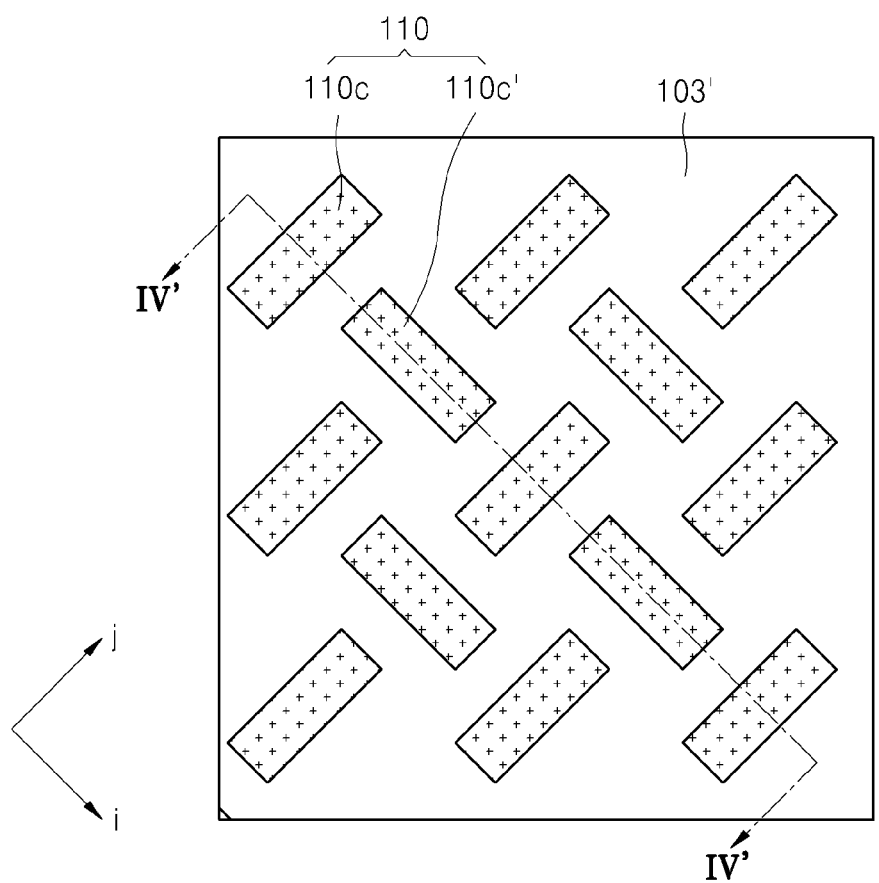
Figure 14B:
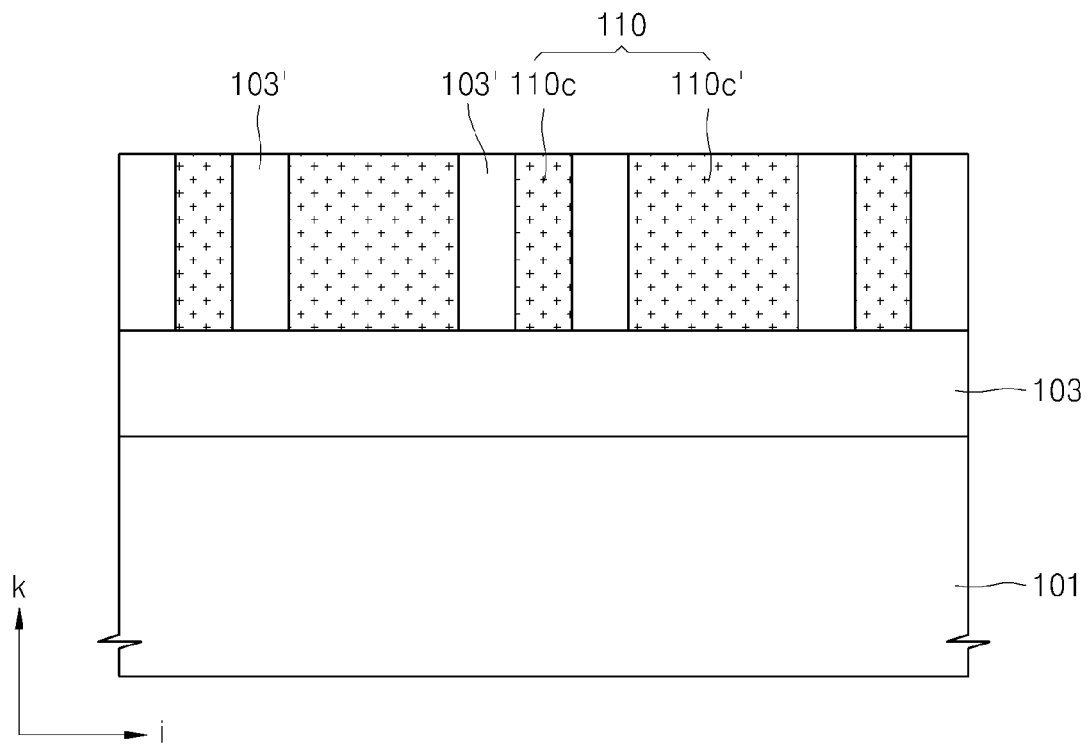

Referring to FIGS. 14A and 14B, spaces among the active regions 110 are filled with an insulating material layer 103'. The insulating material layer 103' may be the same material layer as the insulating layer 103. For example, the insulating material layer 103' may be formed of, for example, an oxide film, a nitride film, or a combination of the oxide film and the nitride film. The insulating material layer 103' and the insulating layer 103 may function as the isolation film 103 described with reference to FIGS. 4A to 4C.

Then, after forming the word lines on a result of the substrate in which the active regions 110 and the insulating material layer 103' are formed, as illustrated in FIGS. 4A to 4C, the source lines 130, the contact plugs 170, the variable resistance structures 140, and the bit lines 150 are formed through common magnetic memory device manufacturing processes to implement the magnetic memory device 100.

A method of forming the active regions 110 of the structure illustrated in FIG. 3 through the line-and-space process has been described. However, the inventive concepts is not limited thereto. For example, other methods of forming the active regions 110 of the structure illustrated in FIG. 3 may be considered as belonging to the inventive concepts.

Figure 15:
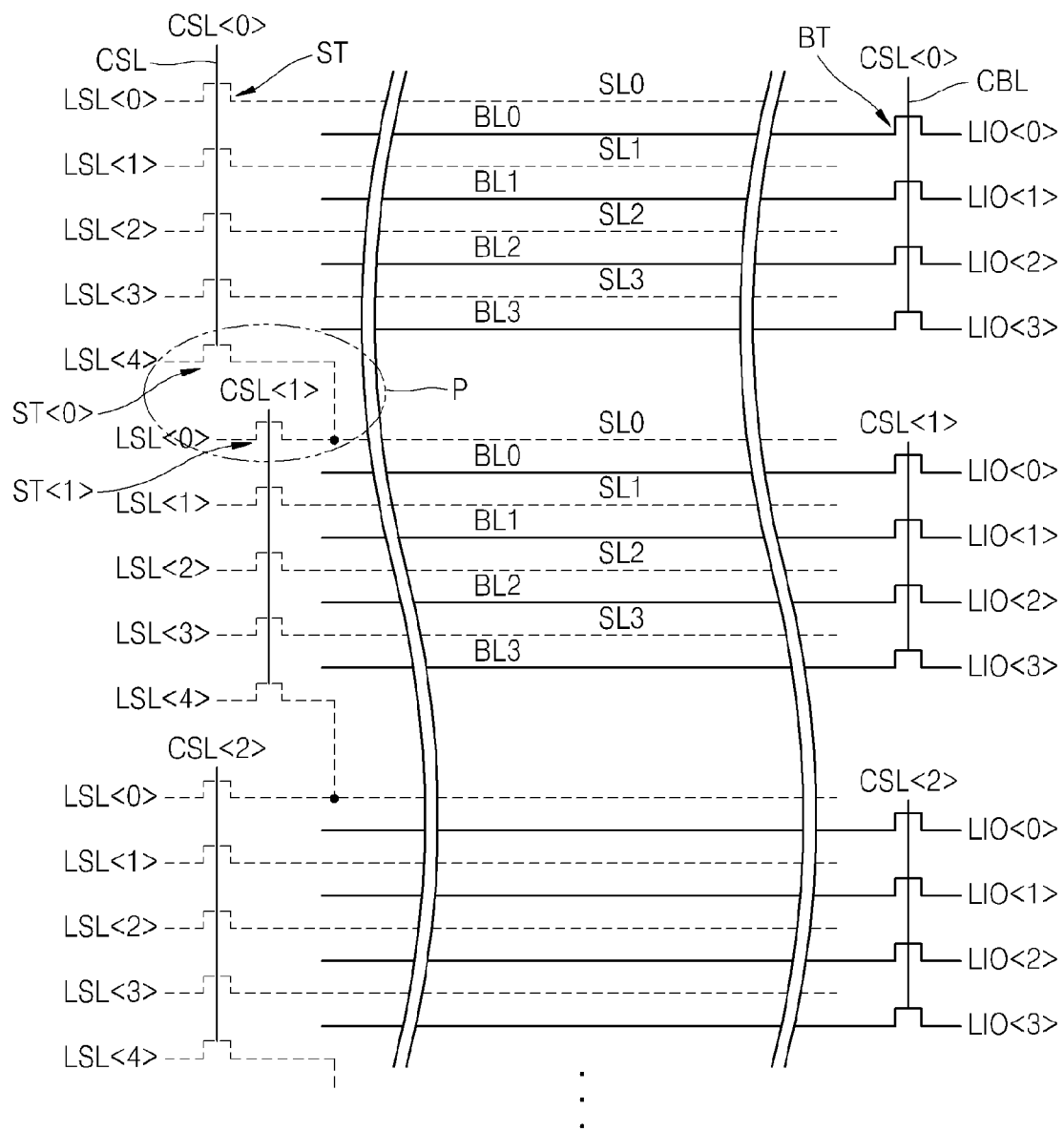
FIG. 15 is a circuit diagram of a memory cell array of a magnetic memory device according to an embodiment of the inventive concepts.

FIG. 15 is a circuit diagram of a memory cell array of a magnetic memory device according to an embodiment of the inventive concepts.

Referring to FIG. 15, the memory cell array of the magnetic memory device 100 according to the present embodiment may be divided in units of blocks along column source lines CSL. For example, in FIG. 15, a first block CSL<0>, a second block CSL<1>, and a third block CSL<2> are illustrated.

In each block, a predetermined number of source lines SL may be connected to a column source line CSL through source line selecting transistors ST. In FIG. 15, it is illustrated that four source lines SL0 to SL3 are connected to a column source line CSL in each block, which is for convenience sake. However, more source lines SL may be commonly connected to a column source line CSL. For example, eight source lines SL may be connected to a column source line CSL in each block.

Like the source lines, a predetermined number of bit lines BL may be connected to a column bit line CBL through bit line selecting transistors BT in each block. As described above, since the number of source lines SL must be equal to that of bit lines BL, the number of source lines SL may be equal to that of bit lines BL in each block. Therefore, when eight source lines SL pass through each block, eight bit lines BL may pass through the same block.

For reference, in FIG. 15, right column bit lines CBL are represented as a first block CSL<0>, a second block CSL<1>, and a third block CSL<2> in a sense that the same concepts of blocks as that applied to the column source lines CSL is applied to the right column bit lines CBL. Here, LSL means a local source line and LIO means local input/output.

The memory cell array structure of the magnetic memory device 100 according to an embodiment may be different from a memory cell array structure of another memory device in that one source line is shared by two adjacent bit lines. That is, in the memory cell array structure of the magnetic memory device 100 according to an embodiment, on each boundary between two blocks, one source line may be connected to column source lines CSL of different blocks through two source line selecting transistors ST. For example, on a boundary P between the first block CSL<0> and the second block CSL<1>, the first source line SL0 of the second block CSL<1> may be connected to the column source line CSL of the first block CSL<0> through a first source line selecting transistor ST<0> and the column source line CSL of the second block CSL<1> through a second source line selecting transistor ST<1>.

Such a connection relationship may contribute to reducing or minimizing waste of an area in the memory cell array structure of the magnetic memory device 100 according to the present embodiment. For example, when a source line on each boundary between two blocks is not shared, a space between a bit line on each boundary between two blocks and a source line on a boundary adjacent to the boundary between the two blocks may not be used to be wasted. As illustrated in FIG. 15, when a source line on each boundary between two blocks is shared by the two blocks, a space between a bit line on each boundary between two blocks and a source line on a boundary adjacent to the boundary between the two blocks may be used as a memory cell space.

A method of sharing a source line on each boundary between two blocks has been described. However, based on relativity of a connection relationship between the source lines and the bit lines, the memory cell array may be designed so that a bit line is shared on each boundary between two blocks. That is, on each boundary between two blocks, one bit line may be connected to column bit lines CBL of different blocks through two bit line selecting transistors BT.

Figure 16:
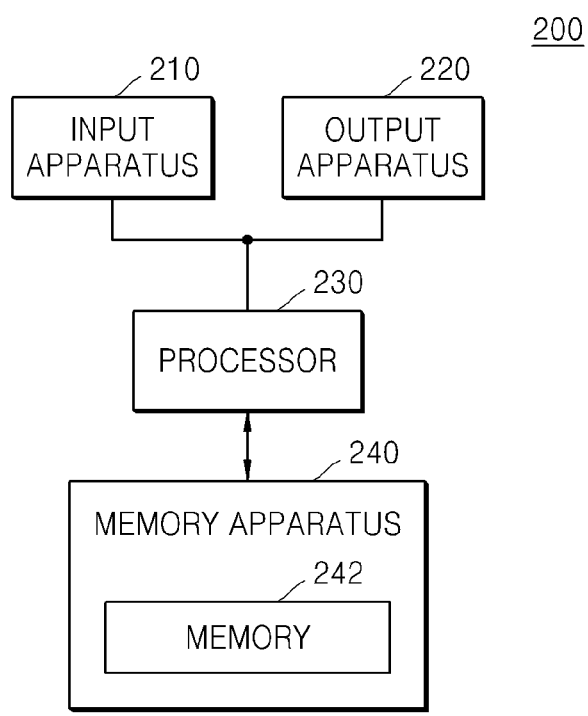
FIG. 16 is a block diagram of an electronic system including a magnetic memory device according to an embodiment of the inventive concepts.

FIG. 16 is a block diagram of an electronic system including a magnetic memory device according to an embodiment of the inventive concepts.

Referring to FIG. 16, an electronic system 200 may include an input apparatus 210, an output apparatus 220, a processor 230, and a memory apparatus 240. In some embodiments, the memory apparatus 240 may include a cell array including non-volatile memory cells and a peripheral circuit for operations such as reading/writing. In other embodiments, the memory apparatus 240 may include a non-volatile memory apparatus and a memory controller.

A memory 242 included in the memory apparatus 240 may include one of the magnetic memory devices 100 and 100a according to the embodiments of the inventive concepts, which are described with reference to FIGS. 1 to 5C and 15.

The processor 230 may be connected to the input apparatus 210, the output apparatus 220, and the memory apparatus 240 through an interface to control an entire operation.

Figure 17:
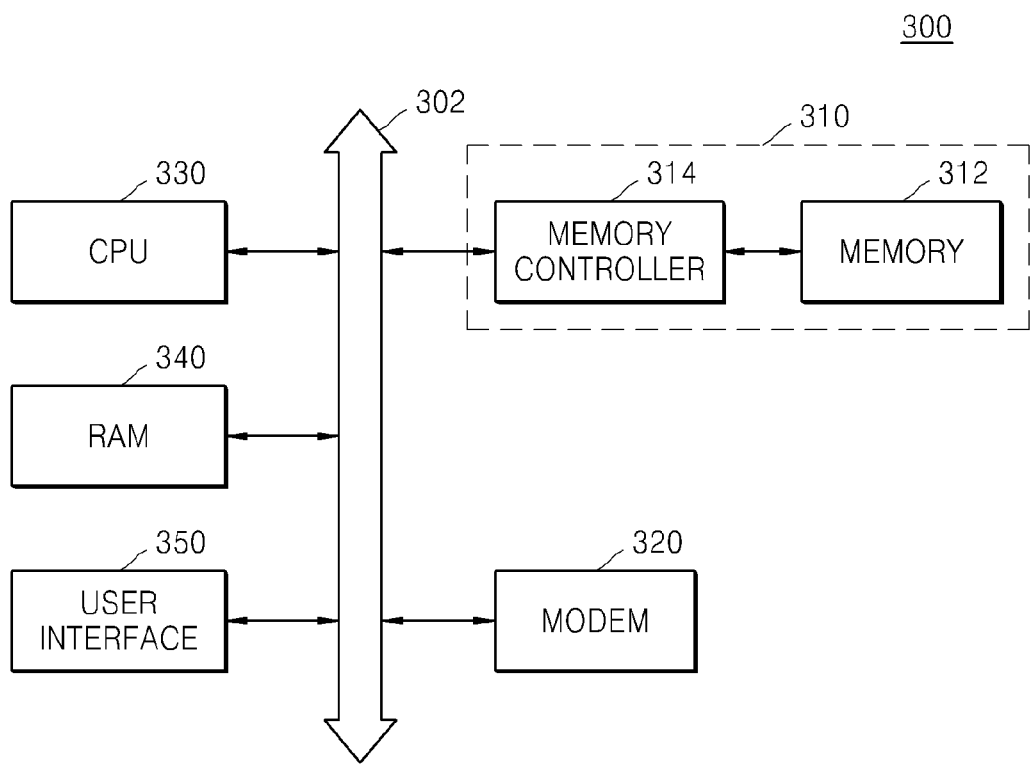
FIG. 17 is a block diagram of an information processing system including a magnetic memory device according to an embodiment of the inventive concepts.

FIG. 17 is a block diagram of an information processing system including a magnetic memory device according to an embodiment of the inventive concepts.

Referring to FIG. 17, the information processing system 300 may include a non-volatile memory system 310, a modem 320, a central processing unit (CPU) 330, a random access memory (RAM) 340, and a user interface 350, which are electrically connected to a bus 302.

The non-volatile memory system 310 may include a memory 312 and a memory controller 314. In the non-volatile memory system 310, data processed by the CPU 330 or data input from the outside may be stored.

The non-volatile memory system 310 may include a non-volatile memory such as a magnetic random access memory (MRAM), a parameter RAM (PRAM), a resistive RAM (RRAM), and a ferroelectric RAM (FRAM). At least one of the memory 312 and the RAM 340 may include one of the magnetic memory devices 100 and 100a according to the embodiments of the inventive concepts, which are described with reference to FIGS. 1 to 5C and 15.

The information processing system 300 may be used for a portable computer, a web tablet, a wireless phone, a mobile phone, a digital music player, a memory card, an MP3 player, a navigator, a portable multimedia player (PMP), a solid state disk (SSD), or household appliances.

Figure 18:
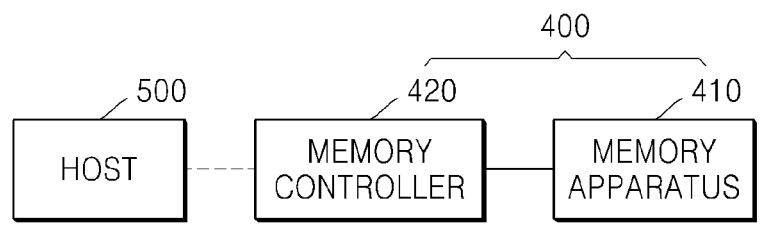
FIG. 18 illustrates a memory card including a magnetic memory device according to the inventive concepts.

FIG. 18 illustrates a memory card including a magnetic memory device according to an embodiment of the inventive concepts.

Referring to FIG. 18, a memory card 400 may include a memory apparatus 410 and a memory controller 420. The memory apparatus 410 may store data. In some embodiments, the memory apparatus 410 may have a non-volatile characteristic capable of maintaining stored data although a power supply is stopped. The memory apparatus 410 may include one of the magnetic memory devices 100 and 100a according to the embodiments of the inventive concepts, which are described with reference to FIGS. 1 to 5C and 15.

The memory controller 420 may read data stored in the memory apparatus 410 or store data in the memory apparatus 410 in response to reading/writing requests of a host 500.

While the inventive concepts has been particularly shown and described with reference to example embodiments thereof, it will be understood that various changes in form and details may be made therein without departing from the spirit and scope of the following claims.

What is claimed is:

1. A magnetic memory device comprising:

a plurality of active regions defined on a substrate by an isolation film, the plurality of active regions are extended in one direction so that a first region and a second region are provided at both ends of each of the plurality of active regions, arranged so that the one direction forms an oblique angle with respect to a first direction, and arranged in parallel in a second direction intersecting the first direction;

a plurality of word lines arranged in parallel in the first direction while extending in the second direction on the substrate across corresponding ones of the plurality of active regions arranged in the second direction;

a plurality of source lines arranged in parallel in the second direction while extending in the first direction and commonly and electrically connected to the first regions of corresponding ones of the plurality of active regions arranged in the first direction;

a plurality of variable resistance structures arranged in the first and second directions to correspond to the plurality of active regions, respectively, and electrically connected to the second regions of corresponding ones of the plurality of active regions; and a plurality of bit lines arranged in parallel in the second direction while extending in the first direction to alternate with the plurality of source lines and commonly and electrically connected to corresponding ones of the plurality of variable resistance structures arranged in the first direction, wherein, when a source line adjacent to a first bit line that is one of the plurality of bit lines below the first bit line in the second direction is referred to as a lower source line and a source line adjacent to the first bit line above the first bit line in the second direction is referred to as an upper source line, in the first direction, the plurality of active regions are alternately arranged between the first bit line and the lower source line and between the first bit line and the upper source line.

2. The magnetic memory device of claim 1, wherein, when a bit line adjacent to a first source line that is one of the plurality of source lines below the first source line in the second direction is referred to as a lower bit line and a bit line adjacent to the first source line above the first source line in the second direction is referred to as an upper bit line, in the first direction, the plurality of active regions are alternately arranged between the first source line and the lower bit line and between the first source line and the upper bit line.

3. The magnetic memory device of claim 1, wherein, when two adjacent source lines among the plurality of source lines are referred to first and second source lines, a bit line arranged between the first and second source lines is referred to as a second bit line, a plurality of active regions arranged between the first source line and the second bit line are referred to as first group active regions, and a plurality of active regions arranged between the second source line and the second bit line are referred to as second group active regions, the first regions of the first group active regions are electrically connected to the first source line, the first regions of the second group active regions are electrically connected to the second source line, and the second regions of the first group active regions and the second group active regions are electrically connected to the second bit line.

4. The magnetic memory device of claim 3,
wherein different ones of the plurality of word lines cross the plurality of active regions of the first group active regions and the second group active regions, respectively, and
wherein only one active region is selected among the plurality of active regions of the first group active regions and the second group active regions by selecting a first word line that is one of the plurality of word lines.

5. The magnetic memory device of claim 1,
wherein at least one of a pitch of the plurality of bit lines in the second direction and a pitch of the plurality of source lines in the second direction is 4F,
wherein a pitch of the plurality of word lines in the first direction is 2F,
wherein a unit memory cell of the magnetic memory device has a size of $8F^2$, and
wherein F means a minimum lithographic feature size.

6. The magnetic memory device of claim 1,
wherein arranged to be adjacent to a first active region are four second active regions, each of the first and second active regions being one of the plurality of active regions,
wherein the four second active regions extend in a same direction, and
wherein the first active region extends in a direction intersecting the direction in which the second active regions extend.

7. The magnetic memory device of claim 1,
wherein the magnetic memory device is divided into units of blocks along column source lines, and
wherein, in each block, a number of the plurality of source lines are connected to one of the a column source lines through source line selecting transistors so that, on each boundary between two blocks, two source line selecting transistors are connected to one of the plurality of source lines and the two source line selecting transistors are connected to the column source lines of different blocks, respectively.

8. The magnetic memory device of claim 1, wherein the plurality of word lines have upper surfaces positioned on a lower level as that of an upper surface of the substrate.

9. The magnetic memory device of claim 1,
wherein the plurality of variable resistance structures are arranged on at least one insulating layer formed on the plurality of active regions, and
wherein the plurality of variable resistance structures are electrically connected to corresponding ones of the plurality of active regions through contact plugs formed through the at least one insulating layer, respectively.

10. The magnetic memory device of claim 1,
wherein the second region of a first active region that is one of the plurality of active regions is electrically connected to only a corresponding first variable resistance structure that is one of the plurality of variable resistance structures,
wherein the first region of the first active region that is one of the plurality of active regions is electrically connected to a first source line that is one of the plurality of source lines, and
wherein a different word line from a word line that crosses the first active region crosses a second active region adjacent to the first active region and having a first region thereof electrically connected to the first source line, the different word line being one of the plurality of word lines.

11. A magnetic memory device comprising:
a plurality of word lines arranged in parallel in a first direction while extending in a second direction on the substrate;
a plurality of source lines arranged in parallel in the second direction orthogonal to the first direction while extending in the first direction on a substrate;
a plurality of bit lines arranged in parallel in the second direction while extending in the first direction on the substrate to alternate with the plurality of source lines; and
a plurality of active regions arranged to extend at an oblique angle with respect to the first direction and arranged so that one memory cell is selected when one of the plurality of word lines and one of the plurality of source lines or the plurality of bit lines are selected.

12. The magnetic memory device of claim 11,
wherein each of the plurality of active regions comprises a first region and a second region at both ends thereof,
wherein a first word line that is one of the plurality of word lines crosses a plurality of active regions arranged in the second direction,
wherein a first source line that is one of the plurality of source lines is commonly and electrically connected to the first regions of corresponding ones of the plurality of active regions arranged in the first direction,
wherein a first bit line that is one of the plurality of bit lines is commonly and electrically connected to the second regions of corresponding ones of the plurality of active regions arranged in the first direction,
wherein a plurality of active regions having first regions thereof electrically connected to two source lines of the plurality of source lines adjacent to the first bit line share the first bit line, and
wherein a plurality of active regions having second regions thereof electrically connected to two bit lines of the plurality of bit lines adjacent to the first source line share the first source line.

13. The magnetic memory device of claim 11, wherein, when the plurality of active regions are arranged between the first bit line that is one of the plurality of bit lines and a first source line adjacent to the first bit line to form the one memory cell in each active region, along the first word line that is one of the plurality of word lines, no memory cell adjacent to the one memory cell is formed between the first bit line and the source line and between the first source line and the bit line.

14. The magnetic memory device of claim 11, wherein, when a plurality of active regions are arranged between the first bit line that is one of the plurality of bit lines and a first source line adjacent to the first bit line to form the one memory cell in each active region, a plurality of memory cells are arranged in zigzags in the first and second directions.

15. The magnetic memory device of claim 11,
wherein the magnetic memory device is divided into units of blocks along column source lines, and
wherein, in each block, a number of the plurality of source lines are connected to one of the column source lines through source line selecting transistors so that, on each boundary between two blocks, two source line selecting transistors are connected to one of the plurality of source lines and the two source line selecting transistors are connected to the column source lines of different blocks, respectively, and the one source line controls memory cells in the two blocks.

16. A magnetic memory device comprising:
a plurality of active regions defined on a substrate by an isolation film, the plurality of active regions are extended in one direction so that a first region and a second region are provided at both ends of each of the plurality of active regions, arranged so that the one direction forms an oblique angle with respect to a first direction, and arranged in parallel in a second direction intersecting the first direction;
a plurality of word lines arranged in parallel in the first direction while extending in the second direction on the substrate across corresponding ones of the plurality of active regions arranged in the second direction;
a plurality of source lines arranged in parallel in the second direction while extending in the first direction and commonly and electrically connected to the first regions of the corresponding ones of plurality of active regions arranged in the first direction;
a plurality of variable resistance structures arranged in the first and second directions to correspond to the plurality of active regions, respectively, and electrically connected to the second regions of corresponding ones of the plurality of active regions; and
a plurality of bit lines arranged in parallel in the second direction while extending in the first direction to alternate with the plurality of source lines and commonly and electrically connected to corresponding ones of the plurality of variable resistance structures arranged in the first direction,
wherein, when a bit line adjacent to a first source line that is one of the plurality of source lines below the first source line in the second direction is referred to as a lower bit line and a bit line adjacent to the first source line above the first source line in the second direction is referred to as an upper bit line, in the first direction, the plurality of active regions are alternately arranged between the first source line and the lower bit line and between the first source line and the upper bit line.

17. The magnetic memory device of claim 16, wherein, when a source line adjacent to a first bit line that is one of the plurality of bit lines below the first bit line in the second direction is referred to as a lower source line and a source line adjacent to the first bit line above the first bit line in the second direction is referred to as an upper source line, in the first direction, the plurality of active regions are alternately arranged between the first bit line and the lower source line and between the first bit line and the upper source line.

18. The magnetic memory device of claim 16, wherein at least one of a plurality of magnetic memory devices comprises a three-dimensional memory array.

19. The magnetic memory device of claim 18, wherein the three-dimensional memory array comprises a non-volatile memory that is monolithically formed in one or more physical levels of memory cells having active areas disposed above a silicon substrate.

20. The magnetic memory device of claim 18, wherein word lines and/or bit lines in the three-dimensional memory array are shared between levels.

* * * * *